US011381254B1

(12) United States Patent
Koila

(10) Patent No.: US 11,381,254 B1
(45) Date of Patent: Jul. 5, 2022

(54) HIGH THROUGHPUT AND AREA EFFICIENT PARTIAL PARALLEL HARD DECODER FOR LOW-DENSITY PARITY-CHECK CODES

(71) Applicant: Smart IOPS, Inc., Milpitas, CA (US)

(72) Inventor: Shriharsha Koila, Bantwal (IN)

(73) Assignee: Smart IOPS, Inc., Milpitas, CA (US)

( * ) Notice: Subject to any disclaimer, the term of this patent is extended or adjusted under 35 U.S.C. 154(b) by 0 days.

(21) Appl. No.: 17/198,463

(22) Filed: Mar. 11, 2021

(51) Int. Cl.
*H03M 13/00* (2006.01)
*H03M 13/11* (2006.01)
*H03M 13/25* (2006.01)

(52) U.S. Cl.
CPC .... *H03M 13/1108* (2013.01); *H03M 13/1148* (2013.01); *H03M 13/251* (2013.01); *H03M 13/255* (2013.01)

(58) Field of Classification Search
CPC ........... H03M 13/1108; H03M 13/255; H03M 13/2948; H03M 13/1154; H03M 13/251
See application file for complete search history.

(56) References Cited

U.S. PATENT DOCUMENTS

| 7,281,192 B2* | 10/2007 | Shen ...................... H04L 1/005 714/790 |
| 8,209,581 B2 | 6/2012 | Yokokawa et al. |
| 8,438,461 B2* | 5/2013 | Varnica ................. H03M 13/112 714/785 |
| 8,910,028 B1* | 12/2014 | Li ........................... H03M 13/23 714/752 |
| 8,929,009 B2* | 1/2015 | Yang ....................... G11B 20/18 360/39 |
| 9,768,807 B2* | 9/2017 | Zhang .................. H03M 13/658 |

OTHER PUBLICATIONS

Tadashi Wadayama, Keisuke Nakamura, Masayuki Yagita, Yuuki Funahashi, Shogo Usami, and Ichi Takumi, "Gradient Descent Bit Flipping Algorithms for Decoding LDPC Codes", 2008 International Symposium on Information Theory and Its Applications, Dec. 7-10, 2008, IEEE, Auckland, New Zealand.

(Continued)

*Primary Examiner* — Esaw T Abraham
(74) *Attorney, Agent, or Firm* — Chip Law Group

(57) ABSTRACT

A hard decoder includes an input data handler that receives and rearranges a low-density parity-check (LDPC) codeword, and a variable node updater that iteratively updates the rearranged LDPC codeword to generate an updated LDPC codeword during each decoding iteration of the rearranged LDPC codeword. The hard decoder further includes a syndrome generator that generates a syndrome vector associated with the updated LDPC codeword of each decoding iteration. During each decoding iteration, the rearranged LDPC codeword is updated based on a threshold value and the syndrome vector associated with the updated LDPC codeword of a previous decoding iteration and a validity of the updated LDPC codeword of the previous decoding iteration. The hard decoder further includes an output data handler that extracts a message from the updated LDPC codeword that is valid and outputs the extracted message.

20 Claims, 9 Drawing Sheets

(56) References Cited

OTHER PUBLICATIONS

Khoa Le, David Declercq, Fakhreddine Ghaffari, Lounis Kessal, Oana Boncalo, and Valentin Savin, "Variable-Node-Shift Based Architecture for Probabilistic Gradient Descent Bit Flipping on QC-LDPC Codes", IEEE Transactions on Circuits and Systems I: Regular Papers, Dec. 18, 2017, pp. 2183-2195, vol. 65, Issue. 7, IEEE.

Mohamed Ismail, Imran Ahmed, and Justin Coon, "Low Power Decoding of LDPC Codes", International Scholarly Research Notices, Jan. 17, 2013, vol. 2013, Article ID. 650740, 12 pages, Hindawi Publishing Corporation.

* cited by examiner

HIGH THROUGHPUT AND AREA EFFICIENT PARTIAL PARALLEL HARD DECODER FOR LOW-DENSITY PARITY-CHECK CODES

FIELD

Various embodiments of the disclosure relate generally to electronic circuits. More specifically, various embodiments of the disclosure relate to a high throughput and area efficient partial parallel hard decoder for low-density parity-check codes.

BACKGROUND

Low-density parity-check (LDPC) codes are widely used error correcting codes. The LDPC codes are utilized to encode a message prior to storing in a memory. When the stored encoded message (also referred to as an "LDPC codeword") is eventually read from the memory, various decoding techniques are executed thereon to reliably extract the original message. One of the most commonly used decoding technique is a hard-decision decoding technique, where the LDPC codeword is decoded exclusively based on various codeword bits of the LDPC codeword (i.e., quantized information retrieved from the memory). A decoder that implements such a technique is referred to as a hard decoder. To decode the LDPC codeword, the hard decoder iteratively updates the codeword bits of the LDPC codeword, generates various syndrome values associated with the updated LDPC codeword, and determines whether the updated LDPC codeword is valid based on the syndrome values.

One type of hard decoder that is commonly utilized for the LDPC codes is a partial parallel hard decoder. Further, there are two types of implementations of the partial parallel hard decoder. In a first implementation, the codeword bits are updated over multiple cycles of a clock signal associated with the partial parallel hard decoder and the syndrome values are generated over a single cycle of the clock signal. On the other hand, in a second implementation, the codeword bits are updated and the syndrome values are generated over multiple cycles of the clock signal. In both the scenarios, the syndrome values are generated exclusively after all the codeword bits are updated. The first implementation typically results in a significant throughput of the partial parallel hard decoder. However, such a hard decoder occupies a significant area on a memory system (e.g., a printed circuit board). On the other hand, the second implementation results in a significant decrease in an area occupied by the partial parallel hard decoder on the memory system. However, there is a significant decrease in a throughput of such a partial parallel hard decoder.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

A high throughput and area efficient partial parallel hard decoder for low-density parity-check codes is provided substantially as shown in, and described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Figure 1:
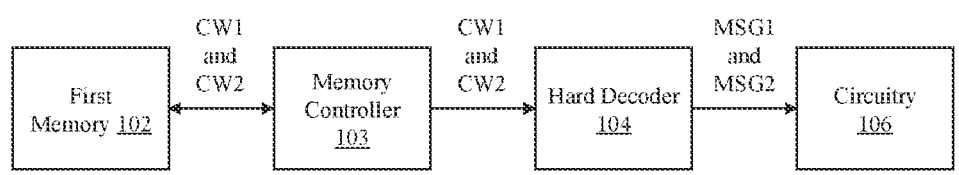
FIG. 1 is a block diagram that illustrates a memory system, in accordance with an exemplary embodiment of the present disclosure.

Certain embodiments of the disclosure may be found in the disclosed hard decoders. Exemplary aspects of the disclosure provide a memory system that includes circuitry, a first memory that is configured to store a first low-density parity-check (LDPC) codeword, and a hard decoder that is coupled to the first memory and the circuitry. The hard decoder for LDPC codes includes an input data handler that is configured to receive the first LDPC codeword from the first memory. The input data handler is further configured to rearrange, based on a reuse factor associated with the hard decoder, a first plurality of codeword bits of the first LDPC codeword to generate a second LDPC codeword that includes one or more sets of codeword bits. The hard decoder further includes a variable node updater that is configured to iteratively update the one or more sets of codeword bits of the second LDPC codeword to generate an updated second LDPC codeword during each decoding iteration of the second LDPC codeword.

The hard decoder further includes a second memory that is configured to store the second LDPC codeword and the updated second LDPC codeword of each decoding iteration. The hard decoder further includes a multiplexer that includes first and second input terminals, a select terminal, and an output terminal. The first input terminal of the multiplexer is coupled to the input data handler, and is configured to receive the second LDPC codeword. The second input terminal of the multiplexer is coupled to the variable node updater, and is configured to receive the updated second LDPC codeword of each decoding iteration. The select terminal of the multiplexer is configured to receive a first control signal. The output terminal of the multiplexer is coupled to the second memory, and is configured to output and store one of the second LDPC codeword or the updated second LDPC codeword in the second memory based on the first control signal. The hard decoder further includes a decode controller that is configured to generate the first control signal. When the first control signal is deactivated, the second LDPC codeword is stored in the second memory. When the first control signal is activated, the updated second LDPC codeword is stored in the second memory.

The hard decoder further includes a syndrome generator that is configured to generate, during each decoding iteration based on the updated second LDPC codeword of the corresponding decoding iteration, a first syndrome vector having one or more sets of syndrome values associated with one or more sets of updated codeword bits of the updated second LDPC codeword, respectively. A first set of syndrome values associated with a first set of updated codeword bits is generated while a second set of updated codeword bits is generated.

The hard decoder further includes an error detector that is coupled to the syndrome generator, and is configured to receive, during each decoding iteration, the first syndrome vector of the corresponding decoding iteration. The error detector is further configured to detect, during each decoding iteration, whether the updated second LDPC codeword of the corresponding decoding iteration is valid based on the first syndrome vector of the corresponding decoding iteration. The error detector is further configured to generate, during each decoding iteration, a status bit to indicate the validity of the updated second LDPC codeword of the corresponding decoding iteration. The status bit is activated when the updated second LDPC codeword is valid, and deactivated when the updated second LDPC codeword is invalid.

The hard decoder further includes a threshold generator that is coupled to the syndrome generator, and is configured to receive, during each decoding iteration of the second LDPC codeword, the first syndrome vector of the corresponding decoding iteration. The threshold generator is further configured to generate, during each decoding iteration of the second LDPC codeword based on the first syndrome vector of the corresponding decoding iteration, a first threshold value associated with the updated second LDPC codeword of the corresponding decoding iteration. During each decoding iteration, the second LDPC codeword is updated based on the first threshold value and the first syndrome vector associated with the updated second LDPC codeword of a previous decoding iteration and a validity of the updated second LDPC codeword of the previous decoding iteration.

The hard decoder further includes a third memory that is coupled to the syndrome generator, the variable node updater, the error detector, and the threshold generator. During each decoding iteration of the second LDPC codeword, the syndrome generator is further configured to store, in the third memory, the first syndrome vector of the corresponding decoding iteration, and the error detector is further configured to store, in the third memory, the status bit of the corresponding decoding iteration. Further, during each decoding iteration, the threshold generator is configured to store, in the third memory, the first threshold value associated with the updated second LDPC codeword of the corresponding decoding iteration, and the variable node updater is configured to generate and store, in the third memory, update information associated with the generation of the updated second LDPC codeword of the corresponding decoding iteration.

The threshold generator is further configured to retrieve, from the third memory during each decoding iteration of the second LDPC codeword, the update information of the corresponding decoding iteration. During each decoding iteration, the threshold generator further generates the first threshold value based on the update information of the corresponding decoding iteration. To generate the first threshold value during each decoding iteration, the threshold generator is further configured to generate a first intermediate value based on the first syndrome vector and the retrieved update information of the corresponding decoding iteration, and convert the first intermediate value to the first threshold value such that a number of bits indicative of the first threshold value is less that a number of bits indicative of the first intermediate value.

During each decoding iteration, the variable node updater is further configured to retrieve, from the third memory, the status bit of the previous decoding iteration, and determine whether the status bit indicates that the updated second LDPC codeword of the previous decoding iteration is valid. The variable node updater updates each codeword bit of the second LDPC codeword when the status bit indicates that the updated second LDPC codeword of the previous decoding iteration is invalid. To update each codeword bit of the second LDPC codeword during each decoding iteration, the variable node updater is further configured to retrieve, from the third memory, the first syndrome vector, the first threshold value, and the update information associated with the updated second LDPC codeword of the previous decoding iteration. The variable node updater is further configured to identify a number of syndrome values of the first syndrome vector that is associated with each codeword bit, and generate a second intermediate value for each codeword bit based on the identified number of syndrome values and the update information. Further, the variable node updater is configured to convert, for each codeword bit, the second intermediate value to a third intermediate value such that a number of bits indicative of the third intermediate value is less than a number of bits indicative of the second intermediate value, and equal to the number of bits indicative of the first threshold value. The variable node updater is further configured to compare, for each codeword bit, the first threshold value and the associated third intermediate value. Each codeword bit of the second LDPC codeword is updated based on a result of the comparison of the first threshold value and the associated third intermediate value.

The hard decoder further includes an output data handler that is configured to receive the updated second LDPC codeword that is valid. The output data handler receives the updated second LDPC codeword over a plurality of decoding iterations of one or more LDPC codewords that are subsequent to the second LDPC codeword such that during each decoding iteration of the one or more LDPC codewords, the output data handler receives a portion of the updated second LDPC codeword. The output data handler is further configured to extract a first message from the updated second LDPC codeword, and output the extracted first message. The output data handler is coupled to the circuitry, and is further configured to provide the extracted first message to the circuitry.

The hard decoder further includes a demultiplexer that includes an input terminal, a select terminal, and first and second output terminals. The input terminal of the demultiplexer is coupled to the second memory, and is configured to receive one of the second LDPC codeword or the updated second LDPC codeword. The input terminal of the demultiplexer receives the second LDPC codeword during a first decoding iteration of the second LDPC codeword, and during each subsequent decoding iteration, the input terminal of the demultiplexer receives the updated second LDPC codeword of the previous decoding iteration. The select terminal of the demultiplexer is configured to receive a second control signal. Further, the first and second output terminals of the demultiplexer are coupled to the output data handler and the variable node updater, respectively. Based on the second control signal, the first output terminal of the demultiplexer is configured to output and provide the updated second LDPC codeword that is valid to the output data handler, and the second output terminal of the demultiplexer is configured to output and provide one of the second LDPC codeword or the updated second LDPC codeword that is invalid to the variable node updater. The decode controller is further configured to generate the second control signal. When the second control signal is deactivated, the updated second LDPC codeword that is valid is outputted and provided to the output data handler, and when the second control signal is activated, one of the second LDPC codeword or the updated second LDPC codeword that is invalid is outputted and provided to the variable node updater.

The input data handler is further configured to receive a third LDPC codeword, and rearrange, based on the reuse factor, a second plurality of codeword bits of the third LDPC codeword to generate a fourth LDPC codeword. The variable node updater is further configured to iteratively update the fourth LDPC codeword to generate an updated fourth LDPC codeword during each decoding iteration of the fourth LDPC codeword. The syndrome generator is further configured to generate, during each decoding iteration of the fourth LDPC codeword based on the updated fourth LDPC codeword of the corresponding decoding iteration, a second syndrome vector associated with the updated fourth LDPC codeword. The output data handler is further configured to receive the updated fourth LDPC codeword that is valid, extract a second message from the updated fourth LDPC codeword, and output and provide the extracted second message to the circuitry. The variable node updater updates the fourth LDPC codeword and the syndrome generator generates the second syndrome vector while the error detector detects whether the updated second LDPC codeword is valid and the threshold generator generates the first threshold value associated with the updated second LDPC codeword.

The error detector is further configured to receive the second syndrome vector of each decoding iteration of the fourth LDPC codeword, and detect whether the updated fourth LDPC codeword of the corresponding decoding iteration is valid. The threshold generator is further configured to receive the second syndrome vector of each decoding iteration of the fourth LDPC codeword, and generate a second threshold value associated with the updated fourth LDPC codeword of the corresponding decoding iteration. The error detector detects whether the updated fourth LDPC codeword is valid and the threshold generator generates the second threshold value while the variable node updater and the syndrome generator generate the updated second LDPC codeword and the first syndrome vector of a subsequent decoding iteration of the second LDPC codeword, respectively.

In the hard decoder of the present disclosure, one set of syndrome values of the syndrome vector is generated after the update of one set of codeword bits of an LDPC codeword (e.g., the second LDPC codeword), and while another set of codeword bits of the LDPC codeword is updated. Further, the validity of the updated LDPC codeword (e.g., the updated second LDPC codeword) is detected and the threshold value for the updated LDPC codeword is generated after the generation of the syndrome vector. The hard decoder of the present disclosure thus implements a partial parallel decoding technique. Further, each set of syndrome values, and in turn each set of updated codeword bits, are generated over a single cycle of a clock signal associated with the hard decoder. Hence, a throughput of the hard decoder of the present disclosure is significantly greater than that of a conventional partial parallel hard decoder where various codeword bits and syndrome values are generated over multiple cycles of an associated clock signal, and the syndrome values are generated exclusively after all the codeword bits are updated. Further, the hard decoder of the present disclosure occupies a significantly less area on a memory system (e.g., a printed circuit board) as compared to an area occupied by another conventional partial parallel hard decoder where codeword bits are updated over multiple cycles of an associated clock signal, and syndrome values are generated over a single cycle of the clock signal and exclusively after all the codeword bits are updated.

FIG. 1 is a block diagram that illustrates a memory system, in accordance with an exemplary embodiment of the present disclosure. Referring to FIG. 1, the memory system 100 includes a first memory 102, a memory controller 103, a hard decoder 104 coupled to the first memory 102 by way of the memory controller 103, and circuitry 106 coupled to the hard decoder 104. The memory system 100 may correspond to a printed circuit board, a field-programmable gate array, an application-specific integrated circuit, or the like.

The first memory 102 is configured to store various low-density parity-check (LDPC) codewords (such as first and second LDPC codewords CW1 and CW2). Such LDPC codewords are generated by encoding various messages with an encoding technique associated with the LDPC codes. In one embodiment, the first memory 102 corresponds to a NAND flash memory. In such a scenario, the memory controller 103 corresponds to a NAND controller. In another embodiment, the first memory 102 corresponds to a NOR flash memory. In such a scenario, the memory controller 103 corresponds to a NOR controller. The memory controller 103 is coupled to the first memory 102, and is configured to access the first memory 102 and retrieve the LDPC codewords (such as the first and second LDPC codewords CW1 and CW2) stored therein.

The hard decoder 104 is configured to receive, by way of the memory controller 103, the LDPC codewords (such as the first and second LDPC codewords CW1 and CW2) stored in the first memory 102. The hard decoder 104 is further configured to execute a decoding operation on the received LDPC codewords to extract the messages included therein. The decoding operation includes iterative update of the LDPC codewords, generation of syndrome vectors for the updated LDPC codewords, detection of whether the updated LDPC codewords are valid based on the generated syndrome vectors, and generation of threshold values that are utilized for the update of the LDPC codewords in a subsequent decoding iteration. For example, the hard decoder 104 is further configured to execute the decoding operation on the first and second LDPC codewords CW1 and CW2 to extract first and second messages MSG1 and MSG2 included therein, respectively. The hard decoder 104 thus executes the decoding operation for the LDPC codes. Further, the hard decoder 104 is configured to output and provide the extracted messages (such as the first and second messages MSG1 and MSG2) to the circuitry 106. Based on the received messages, the circuitry 106 may be configured to execute various data processing operations. Examples of the circuitry 106 may include processors, digital circuits, or the like.

Figure 2:
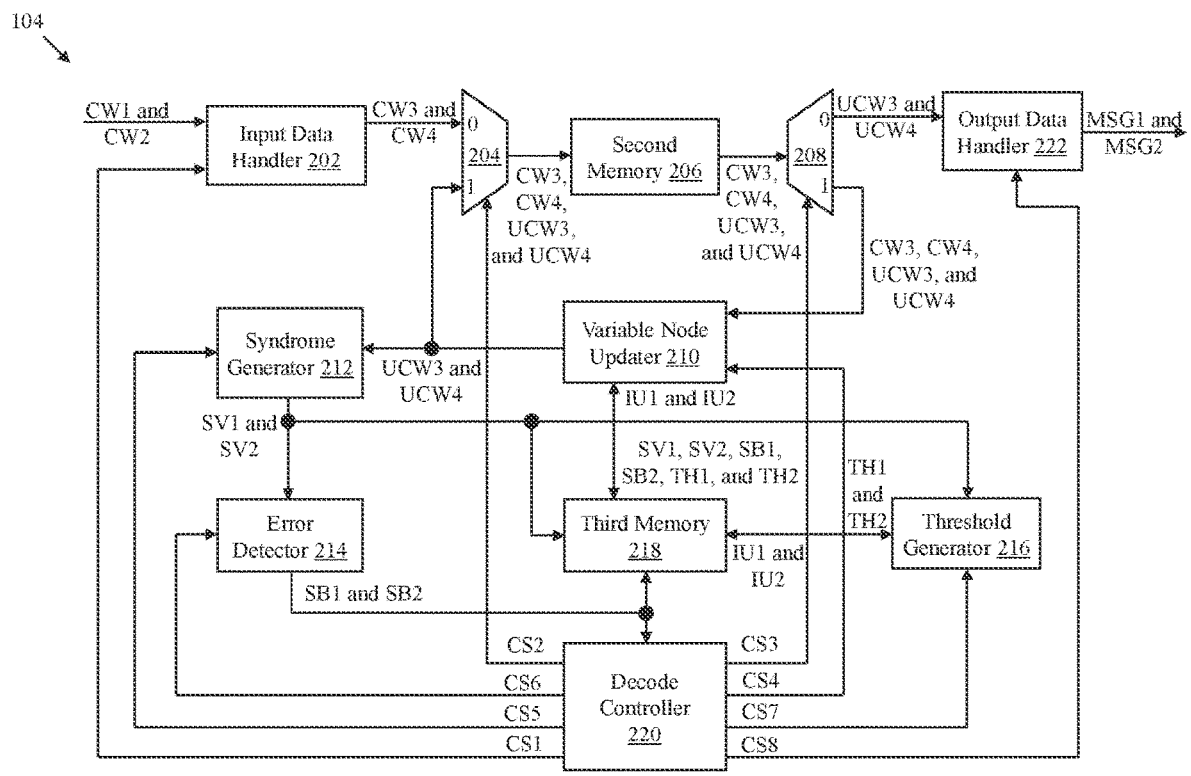
FIG. 2 is a block diagram that illustrates a hard decoder of the memory system of FIG. 1, in accordance with an exemplary embodiment of the present disclosure.

FIG. 2 is a block diagram that illustrates a hard decoder, in accordance with an exemplary embodiment of the present disclosure. Referring to FIG. 2, the hard decoder 104 includes an input data handler 202, a multiplexer (mux) 204, a second memory 206, a demultiplexer (demux) 208, a variable node updater 210, a syndrome generator 212, an error detector 214, a threshold generator 216, a third memory 218, a decode controller 220, and an output data handler 222.

The input data handler 202 is coupled to the memory controller 103. The input data handler 202 may include suitable logic, circuitry, interfaces, and/or code, executable by the circuitry, that may be configured to perform one or more operations. For example, the input data handler 202 is configured to receive the first and second LDPC codewords CW1 and CW2 from the memory controller 103. The first and second LDPC codewords CW1 and CW2 are received sequentially. The input data handler 202 is further coupled to the decode controller 220, and is configured to receive a first control signal CS1 that controls an operation of the input data handler 202. In an embodiment, when the first control signal CS1 is deactivated (i.e., is at a logic low state), the input data handler 202 is activated (i.e., the input data handler 202 is operational). Similarly, when the first control signal CS1 is activated (i.e., is at a logic high state), the input data handler 202 is deactivated (i.e., the input data handler 202 is non-operational).

When the input data handler 202 is operational, the input data handler 202 is further configured to rearrange, based on a reuse factor associated with the hard decoder 104, first and second pluralities of codeword bits (not shown) of the first and second LDPC codewords CW1 and CW2 to generate third and fourth LDPC codewords CW3 and CW4, respectively. Each of the third and fourth LDPC codewords CW3 and CW4 includes one or more sets of codeword bits (not shown).

The one or more sets of codeword bits of the third LDPC codeword CW3 are generated such that a first codeword bit of a first set of codeword bits of the third LDPC codeword CW3 is same as a first codeword bit of the first plurality of codeword bits. Further, a second codeword bit of the first set of codeword bits is same as an $m^{th}$ codeword bit of the first plurality of codeword bits. In such a scenario, the distance between the first and $m^{th}$ codeword bits of the first plurality of codeword bits is equal to the reuse factor associated with the hard decoder 104. For example, if the reuse factor is equal to three, the second codeword bit of the first set of codeword bits is same as a fourth codeword bit of the first plurality of codeword bits. Additionally, the rearrangement is executed in a circular manner. Further, the one or more sets of codeword bits of the third LDPC codeword CW3 are generated such that the first set of codeword bits of the third LDPC codeword CW3 corresponds to a first portion of the first plurality of codeword bits. For example, if a number of codeword bits in the first plurality of codeword bits is equal to 9000, and a number of codeword bits in each set of the one or more sets of codeword bits of the third LDPC codeword CW3 is equal to 3000, the first set of codeword bits corresponds to first 3000 codeword bits of the first plurality of codeword bits. It will be apparent to a person skilled in the art that the one or more sets of codeword bits of the fourth LDPC codeword CW4 are generated in a similar manner as described above.

The mux 204 includes first and second input terminals that are coupled to the input data handler 202 and the variable node updater 210, respectively. The first input terminal of the mux 204 is configured to receive the third LDPC codeword CW3 from the input data handler 202. The second input terminal of the mux 204 is configured to receive, from the variable node updater 210, an updated third LDPC codeword UCW3 of each decoding iteration of the third LDPC codeword CW3. The mux 204 further includes a select terminal that is coupled to the decode controller 220, and is configured to receive a second control signal CS2.

The mux 204 further includes an output terminal that is coupled to the second memory 206, and is configured to output and store, based on the second control signal CS2, one of the third LDPC codeword CW3 or the updated third LDPC codeword UCW3 in the second memory 206. In an embodiment, when the second control signal CS2 is deactivated (i.e., is at a logic low state), the third LDPC codeword CW3 is stored in the second memory 206. Similarly, when the second control signal CS2 is activated (i.e., is at a logic high state), the updated third LDPC codeword UCW3 is stored in the second memory 206. It will be apparent to a person skilled in the art that the input data handler 202 and the variable node updater 210 generate and provide various enable signals and addresses to the second memory 206 for storing the third LDPC codeword CW3 and the updated third LDPC codeword UCW3 in the second memory 206, respectively.

It will be apparent to a person skilled in the art that the mux 204 is similarly configured to receive, from the input data handler 202 and the variable node updater 210, the fourth LDPC codeword CW4 and an updated fourth LDPC codeword UCW4 of each decoding iteration of the fourth LDPC codeword CW4, respectively. In such a scenario, the mux 204 is further configured to output and store, in the second memory 206 based on the second control signal CS2, one of the fourth LDPC codeword CW4 or the updated fourth LDPC codeword UCW4 in a similar manner as described above.

The second memory 206 is configured to store various LDPC codewords. For example, the second memory 206 is configured to store the third and fourth LDPC codewords CW3 and CW4 generated by the input data handler 202. Similarly, the second memory 206 is configured to store the updated third and fourth LDPC codewords UCW3 and UCW4 generated by the variable node updater 210 during each decoding iteration of the third and fourth LDPC codewords CW3 and CW4, respectively. In one embodiment, the second memory 206 is a random-access memory.

The demux 208 includes an input terminal that is coupled to the second memory 206, and is configured to receive one of the third LDPC codeword CW3 or the updated third LDPC codeword UCW3. The input terminal of the demux 208 receives the third LDPC codeword CW3 during the first decoding iteration of the third LDPC codeword CW3. During each subsequent decoding iteration of the third LDPC codeword CW3, the input terminal of the demux 208 receives the updated third LDPC codeword UCW3 of the previous decoding iteration. The demux 208 further includes a select terminal that is coupled to the decode controller 220, and is configured to receive a third control signal CS3.

The demux 208 further includes first and second output terminals that are coupled to the output data handler 222 and the variable node updater 210, respectively. Based on the third control signal CS3, one of the first or second output terminal of the demux 208 outputs the received LDPC codeword (i.e., one of the third LDPC codeword CW3 or the updated third LDPC codeword UCW3). For example, when the third control signal CS3 is deactivated (i.e., is at a logic low state), the first output terminal of the demux 208 is configured to output and provide the updated third LDPC codeword UCW3 that is valid to the output data handler 222. Similarly, when the third control signal CS3 is activated (i.e., is at a logic high state), the second output terminal of the demux 208 is configured to output and provide one of the third LDPC codeword CW3 or the updated third LDPC codeword UCW3 that is invalid (i.e., has one or more errors) to the variable node updater 210. The second output terminal of the demux 208 outputs the third LDPC codeword CW3 during the first decoding iteration of the third LDPC codeword CW3. During each subsequent decoding iteration of the third LDPC codeword CW3, the second output terminal of the demux 208 outputs the invalid updated third LDPC codeword UCW3 of the previous decoding iteration. It will be apparent to a person skilled in the art that the output data handler 222 and the variable node updater 210 generate and provide various enable signals and addresses to the second memory 206 for retrieving the third LDPC codeword CW3 and the updated third LDPC codeword UCW3 from the second memory 206.

It will be apparent to a person skilled in the art that the demux 208 is similarly configured to receive one of the fourth LDPC codeword CW4 or the updated fourth LDPC codeword UCW4. Further, the demux 208 is configured to output and provide, based on the third control signal CS3, the updated fourth LDPC codeword UCW4 that is valid to the output data handler 222, and one of the fourth LDPC codeword CW4 or the updated fourth LDPC codeword UCW4 that is invalid to the variable node updater 210 in a similar manner as described above.

The variable node updater 210 is further coupled to the decode controller 220. The variable node updater 210 may include suitable logic, circuitry, interfaces, and/or code, executable by the circuitry, that may be configured to perform one or more operations. For example, the variable node updater 210 is configured to receive, from the decode controller 220, a fourth control signal CS4 that controls an operation of the variable node updater 210. In an embodiment, when the fourth control signal CS4 is deactivated (i.e., is at a logic low state), the variable node updater 210 is activated (i.e., the variable node updater 210 is operational). Similarly, when the fourth control signal CS4 is activated (i.e., is at a logic high state), the variable node updater 210 is deactivated (i.e., the variable node updater 210 is non-operational).

When the variable node updater 210 is operational, the variable node updater 210 is configured to receive the third LDPC codeword CW3, and iteratively update the one or more sets of codeword bits of the third LDPC codeword CW3 to generate the updated third LDPC codeword UCW3 during each decoding iteration of the third LDPC codeword CW3. During each decoding iteration, the third LDPC codeword CW3 is updated based on a first threshold value TH1 and a first syndrome vector SV1 associated with the updated third LDPC codeword UCW3 of the previous decoding iteration and a validity of the updated third LDPC codeword UCW3 of the previous decoding iteration. The variable node updater 210 includes various updating circuits (not shown) for updating the one or more sets of codeword bits such that a number updating circuits is equal to a number of codeword bits in one set of codeword bits of the third LDPC codeword CW3. Thus, each updating circuit updates multiple codeword bits of the third LDPC codeword CW3. The number of bits updated by a single updating circuit is referred to as the reuse factor associated with the hard decoder 104.

Prior to the reception of the third LDPC codeword CW3 and the update of the one or more sets of codeword bits during each decoding iteration, the variable node updater 210 is further coupled to the third memory 218, and is configured to retrieve a first status bit SB1 of the previous decoding iteration. The first status bit SB1 is indicative of the validity of the updated third LDPC codeword UCW3 of the previous decoding iteration. The variable node updater 210 is further configured to determine whether the first status bit SB1 indicates that the updated third LDPC codeword UCW3 of the previous decoding iteration is valid. The variable node updater 210 generates the updated third LDPC codeword UCW3 of a current decoding iteration exclusively when the updated third LDPC codeword UCW3 of the previous decoding iteration is invalid.

The updated third LDPC codeword UCW3 of each decoding iteration is then stored in the second memory 206 by way of the mux 204. Further, the variable node updater 210 is configured to generate and store, in the third memory 218 during each decoding iteration, first update information IU1 associated with the generation of the updated third LDPC codeword UCW3 of the corresponding decoding iteration. The first update information IU1 may be indicative of various codeword bits that are flipped during each decoding iteration.

To update each codeword bit of the third LDPC codeword CW3 during each decoding iteration, the variable node updater 210 is further configured to retrieve, from the third memory 218, the first syndrome vector SV1, the first threshold value TH1, and the first update information IU1 associated with the updated third LDPC codeword UCW3 of the previous decoding iteration. The variable node updater 210 retrieves the first syndrome vector SV1, the first threshold value TH1, and the first update information IU1 when the first status bit SB1 indicates that the updated third LDPC codeword UCW3 of the previous decoding iteration is invalid. The first syndrome vector SV1 includes one or more sets of syndrome values associated with one or more sets of updated codeword bits of the updated third LDPC codeword UCW3, respectively.

The variable node updater 210 is further configured to identify a number of syndrome values of the first syndrome vector SV1 that is associated with each codeword bit. For each codeword bit, the variable node updater 210 is further configured to generate a first intermediate value (now shown) based on the identified number of syndrome values and the retrieved first update information IU1, and convert the first intermediate value to a second intermediate value (not shown). The first intermediate value is converted to the second intermediate value such that a number of bits indicative of the second intermediate value is less than a number of bits indicative of the first intermediate value, and equal to a number of bits indicative of the first threshold value TH1. Further, the variable node updater 210 is configured to compare, for each codeword bit, the first threshold value TH1 and the associated second intermediate value. Each codeword bit of the third LDPC codeword CW3 is updated based on a result of the comparison of the first threshold value TH1 and the associated second intermediate value. For example, when the result of the comparison indicates that the first threshold value TH1 is less than or equal to the second intermediate value, the associated codeword bit is flipped (i.e., a logic state of the codeword bit is toggled). Similarly, when the result of the comparison indicates that the first threshold value TH1 is greater than the second intermediate value, a logic state of the associated codeword bit is retained.

It will be apparent to a person skilled in the art that the variable node updater 210 is further configured to receive the fourth LDPC codeword CW4 and iteratively update the fourth LDPC codeword CW4 to generate the updated fourth LDPC codeword UCW4 during each decoding iteration of the fourth LDPC codeword CW4 in a similar manner as described above. Further, the variable node updater 210 is configured to generate and store, in the third memory 218 during each decoding iteration of the fourth LDPC codeword CW4, second update information IU2 associated with the generation of the updated fourth LDPC codeword UCW4 of the corresponding decoding iteration in a similar manner as described above.

The syndrome generator 212 is coupled to the variable node updater 210 and the decode controller 220. The syndrome generator 212 may include suitable logic, circuitry, interfaces, and/or code, executable by the circuitry, that may be configured to perform one or more operations. For example, the syndrome generator 212 is configured to receive a fifth control signal CS5 from the decode controller 220 that controls an operation of the syndrome generator 212. In an embodiment, when the fifth control signal CS5 is deactivated (i.e., is at a logic low state), the syndrome generator 212 is activated (i.e., the syndrome generator 212 is operational). Similarly, when the fifth control signal CS5 is activated (i.e., is at a logic high state), the syndrome generator 212 is deactivated (i.e., the syndrome generator 212 is non-operational).

When the syndrome generator 212 is operational, the syndrome generator 212 is configured to receive, from the variable node updater 210, the updated third LDPC codeword UCW3 of each decoding iteration of the third LDPC codeword CW3. Further, during each decoding iteration, the syndrome generator 212 is configured to generate, based on the updated third LDPC codeword UCW3 of the corresponding decoding iteration, the first syndrome vector SV1. The first syndrome vector SV1 includes the one or more sets of syndrome values associated with the one or more sets of updated codeword bits of the updated third LDPC codeword UCW3, respectively. A first set of syndrome values associated with the first set of updated codeword bits is generated by the syndrome generator 212 while a second set of updated codeword bits is generated by the variable node updater 210. In an embodiment, the first set of syndrome values, and in turn the second set of updated codeword bits, are generated over a single cycle of a clock signal (not shown) associated with the hard decoder 104. Thus, the updated third LDPC codeword UCW3 and the first syndrome vector SV1 are generated over a predetermined number of cycles of the clock signal. The predetermined number of cycles of the clock signal are determined based on a codeword length of the third LDPC codeword CW3 and the reuse factor associated with the hard decoder 104.

The syndrome generator 212 includes various syndrome circuits (not shown) for generating the first syndrome vector SV1 (i.e., the one or more sets of syndrome values) such that a number syndrome circuits is equal to a number of codeword bits in one set of updated codeword bits of the updated third LDPC codeword UCW3. Thus, each syndrome circuit generates multiple syndrome values. In an embodiment, the number of syndrome values generated by a single syndrome circuit is equal to the reuse factor associated with the hard decoder 104. The syndrome generator 212 is further coupled to the third memory 218, and is configured to store, during each decoding iteration of the third LDPC codeword CW3, the first syndrome vector SV1 of the corresponding decoding iteration in the third memory 218.

It will be apparent to a person skilled in the art that the syndrome generator 212 is further configured to receive, during each decoding iteration of the fourth LDPC codeword CW4, the updated fourth LDPC codeword UCW4 of the corresponding decoding iteration, and generate a second syndrome vector SV2 associated with the updated fourth LDPC codeword UCW4 in a similar manner as described above.

The error detector 214 is coupled to the syndrome generator 212 and the decode controller 220. The error detector 214 may include suitable logic, circuitry, interfaces, and/or code, executable by the circuitry, that may be configured to perform one or more operations. For example, the error detector 214 is configured to receive a sixth control signal CS6 from the decode controller 220 that controls an operation of the error detector 214. In an embodiment, when the sixth control signal CS6 is deactivated (i.e., is at a logic low state), the error detector 214 is activated (i.e., the error detector 214 is operational). Similarly, when the sixth control signal CS6 is activated (i.e., is at a logic high state), the error detector 214 is deactivated (i.e., the error detector 214 is non-operational).

When the error detector 214 is operational, the error detector 214 is further configured to receive the first syndrome vector SV1 generated during each decoding iteration of the third LDPC codeword CW3. Based on the received first syndrome vector SV1, the error detector 214 is further configured to detect whether the updated third LDPC codeword UCW3 of the corresponding decoding iteration is valid. In one embodiment, when each syndrome value of the one or more sets of syndrome values of the first syndrome vector SV1 is zero, the updated third LDPC codeword UCW3 is valid. Further, when at least one syndrome value of the one or more sets of syndrome values of the first syndrome vector SV1 is a non-zero value, the updated third LDPC codeword UCW3 is invalid (i.e., the updated third LDPC codeword UCW3 has one or more errors). The error detector 214 is further configured to generate, during each decoding iteration, the first status bit SB1 to indicate the validity of the updated third LDPC codeword UCW3 of the corresponding decoding iteration. The first status bit SB1 is activated and deactivated when the updated third LDPC codeword UCW3 is valid and invalid, respectively. The error detector 214 is further coupled to the third memory 218, and is configured to store, during each decoding iteration of the third LDPC codeword CW3, the first status bit SB1 of the corresponding decoding iteration in the third memory 218. Additionally, the error detector 214 is further configured to provide the first status bit SB1 to the decode controller 220.

It will be apparent to a person skilled in the art that during each decoding iteration of the fourth LDPC codeword CW4, the error detector 214 is further configured to receive the second syndrome vector SV2 of the corresponding decoding iteration, and detect whether the updated fourth LDPC codeword UCW4 of the corresponding decoding iteration is valid in a similar manner as described above. Further, the error detector 214 is configured to generate and store, in the third memory 218 during each decoding iteration, a second status bit SB2 that is indicative of the validity of the updated fourth LDPC codeword UCW4 of the corresponding decoding iteration in a similar manner as described above.

The threshold generator 216 is coupled to the syndrome generator 212 and the decode controller 220. The threshold generator 216 may include suitable logic, circuitry, interfaces, and/or code, executable by the circuitry, that may be configured to perform one or more operations. For example, the threshold generator 216 is configured to receive a seventh control signal CS7 from the decode controller 220 that controls an operation of the threshold generator 216. In an embodiment, when the seventh control signal CS7 is deactivated (i.e., is at a logic low state), the threshold generator 216 is activated (i.e., the threshold generator 216 is operational). Similarly, when the seventh control signal CS7 is activated (i.e., is at a logic high state), the threshold generator 216 is deactivated (i.e., the threshold generator 216 is non-operational).

When the threshold generator 216 is operational, the threshold generator 216 is further configured to receive the first syndrome vector SV1 generated during each decoding iteration of the third LDPC codeword CW3. The threshold generator 216 is further configured to retrieve, from the third memory 218 during each decoding iteration of the third LDPC codeword CW3, the first update information IU1 of the corresponding decoding iteration. Further, during each decoding iteration of the third LDPC codeword CW3, the threshold generator 216 is configured to generate the first threshold value TH1 associated with the updated third LDPC codeword UCW3 of the corresponding decoding iteration based on the received first syndrome vector SV1 and the retrieved first update information IU1. Although it is described that the first threshold value TH1 is generated based on the received first syndrome vector SV1 and the retrieved first update information IU1, the scope of the present disclosure is not limited to it. In various other embodiments, the first threshold value TH1 may be generated exclusively based on the received first syndrome vector SV1, without deviating from the scope of the present disclosure. The threshold generator 216 is further coupled to the third memory 218, and is configured to store, during each decoding iteration of the third LDPC codeword CW3, the first threshold value TH1 of the corresponding decoding iteration in the third memory 218.

To generate the first threshold value TH1 during each decoding iteration of the third LDPC codeword CW3, the threshold generator 216 is further configured to generate a third intermediate value (not shown) based on the retrieved first update information IU1 and the first syndrome vector SV1 of the corresponding decoding iteration. The threshold generator 216 is further configured to convert the third intermediate value to the first threshold value TH1 such that the number of bits indicative of the first threshold value TH1 is less than a number of bits indicative of the third intermediate value.

It will be apparent to a person skilled in the art that during each decoding iteration of the fourth LDPC codeword CW4, the threshold generator 216 is further configured to receive the second syndrome vector SV2 of the corresponding decoding iteration and retrieve the second update information IU2 of the corresponding decoding iteration. Further, the threshold generator 216 is configured to generate a second threshold value TH2 associated with the updated fourth LDPC codeword UCW4 of the corresponding decoding iteration based on the second syndrome vector SV2 and the second update information IU2 in a similar manner as described above.

Thus, in the hard decoder 104, one set of syndrome values of a syndrome vector (e.g., the first and second syndrome vectors SV1 and SV2) is generated after the update of one set of codeword bits of an LDPC codeword (e.g., the third and fourth LDPC codewords CW3 and CW4), and while another set of codeword bits of the LDPC codeword is updated. Further, the validity of the updated LDPC codeword (e.g., the updated third and fourth LDPC codewords UCW3 and UCW4) is detected and a threshold value (e.g., the first and second threshold values TH1 and TH2) for the updated LDPC codeword is generated after the generation of the syndrome vector. The hard decoder 104 thus implements a partial parallel decoding technique (i.e., is a hard decoder with a partial parallel implementation). Hence, the hard decoder 104 is also referred to as a "partial parallel hard decoder 104".

The third memory 218 is configured to store, during each decoding iteration of the third LDPC codeword CW3, the first syndrome vector SV1 and the first status bit SB1 of the corresponding decoding iteration. Further, during each decoding iteration of the third LDPC codeword CW3, the third memory 218 is configured to store the first threshold value TH1 and the first update information IU1 associated with the updated third LDPC codeword UCW3 of each decoding iteration. Similarly, during each decoding iteration of the fourth LDPC codeword CW4, the third memory 218 is further configured to store the second syndrome vector SV2 and the second status bit SB2 of the corresponding decoding iteration. Further, during each decoding iteration of the fourth LDPC codeword CW4, the third memory 218 is configured to store the second threshold value TH2 and the second update information IU2 associated with the updated fourth LDPC codeword UCW4 of each decoding iteration. In one embodiment, the third memory 218 is a buffer memory.

The decode controller 220 may include suitable logic, circuitry, interfaces, and/or code, executable by the circuitry, that may be configured to perform one or more operations. For example, the decode controller 220 is configured to generate the first through seventh control signals CS1-CS7 to control the operations of the input data handler 202, the mux 204, the demux 208, the variable node updater 210, the syndrome generator 212, the error detector 214, and the threshold generator 216, respectively. The second control signal CS2 is generated such that when the second control signal CS2 is deactivated, the third or fourth LDPC codeword CW3 or CW4 is stored in the second memory 206, and when the second control signal CS2 is activated, the updated third or fourth LDPC codeword UCW3 or UCW4 is stored in the second memory 206. Similarly, the third control signal CS3 is generated such that when the third control signal CS3 is deactivated, the updated third or fourth LDPC codeword UCW3 or UCW4 that is valid is outputted and provided to the output data handler 222. Further, when the third control signal CS3 is activated, the third LDPC codeword CW3, the fourth LDPC codeword CW4, the updated third LDPC codeword UCW3 that is invalid, or the updated fourth LDPC codeword UCW4 that is invalid is outputted and provided to the variable node updater 210. The first and fourth through seventh control signals CS1 and CS4-CS7 are generated such that the first and fourth through seventh control signals CS1 and CS4-CS7 are activated when the hard decoder 104 does not receive any LDPC codewords from the memory controller 103.

The decode controller 220 is further configured to receive, from the error detector 214 during each decoding iteration of the third LDPC codeword CW3, the first status bit SB1 of the corresponding decoding iteration. Based on the received first status bit SB1, the decode controller 220 is further configured to generate an eighth control signal CS8 to control an operation of the output data handler 222. Further, the decode controller 220 is coupled to the output data handler 222, and is configured to provide the eighth control signal CS8 to the output data handler 222. In an embodiment, when the first status bit SB1 indicates that the updated third LDPC codeword UCW3 is invalid, the eighth control signal CS8 is activated (i.e., is at a logic high state) to deactivate the output data handler 222. When the first status bit SB1 indicates that the updated third LDPC codeword UCW3 is valid, the eighth control signal CS8 is deactivated (i.e., is at a logic low state) to activate the output data handler 222 for receiving the updated third LDPC codeword UCW3 that is valid in a subsequent decoding iteration.

It will be apparent to a person skilled in the art that the decode controller 220 is further configured to receive, from the error detector 214 during each decoding iteration of the fourth LDPC codeword CW4, the second status bit SB2 of the corresponding decoding iteration, and generate the eighth control signal CS8 based on the received second status bit SB2 in a similar manner as described above.

The output data handler 222 may include suitable logic, circuitry, interfaces, and/or code, executable by the circuitry, that may be configured to perform one or more operations. For example, the output data handler 222 is configured to receive the eighth control signal CS8 from the decode controller 220 that controls an operation of the output data handler 222. In an embodiment, when the eighth control signal CS8 is deactivated (i.e., is at a logic low state), the output data handler 222 is activated (i.e., the output data handler 222 is operational). Similarly, when the eighth control signal CS8 is activated (i.e., is at a logic high state), the output data handler 222 is deactivated (i.e., the output data handler 222 is non-operational).

When the output data handler 222 is operational, the output data handler 222 is further configured to receive the updated third LDPC codeword UCW3 that is valid, and extract the first message MSG1 from the updated third LDPC codeword UCW3. The output data handler 222 receives the updated third LDPC codeword UCW3 that is valid over a plurality of decoding iterations of the fourth LDPC codeword CW4 and/or a fifth LDPC codeword (not shown) that is generated by the input data handler 202 after the generation of the third and fourth LDPC codewords CW3 and CW4. Thus, during each decoding iteration of the fourth LDPC codeword CW4 and/or the fifth LDPC codeword, the output data handler 222 receives a portion of the updated third LDPC codeword UCW3. In an embodiment, the output data handler 222 extracts a set of message bits (not shown) from the received portion. The set of message bits extracted over a plurality of decoding iterations constitute the first message MSG1. In another embodiment, the output data handler 222 extracts the first message MSG1 upon the reception of the entirety of the updated third LDPC codeword UCW3 that is valid.

It will be apparent to a person skilled in the art that the output data handler 222 is further configured to receive the updated fourth LDPC codeword UCW4 that is valid, and extract the second message MSG2 from the updated fourth LDPC codeword UCW4 in a similar manner as described above. The output data handler 222 is further coupled to the circuitry 106, and is further configured to output and provide the extracted first and second messages MSG1 and MSG2 to the circuitry 106.

Figure 3:
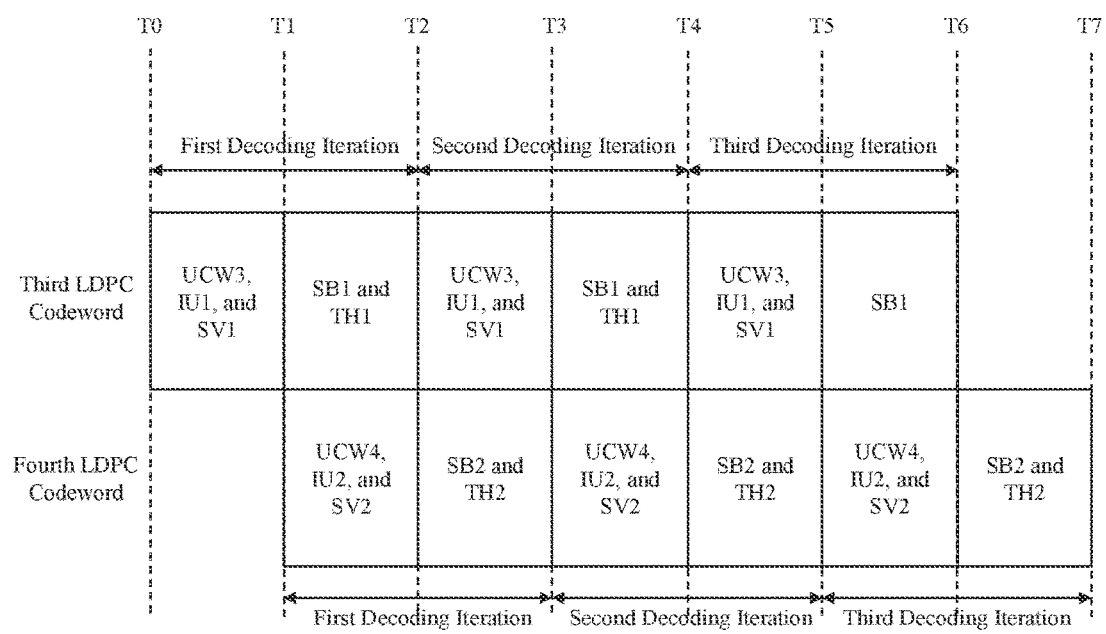
FIG. 3 is a timing diagram that illustrates an operation of the hard decoder, in accordance with an exemplary embodiment of the present disclosure.

FIG. 3 is a timing diagram 300 that illustrates the operation of the hard decoder 104, in accordance with an exemplary embodiment of the present disclosure. The hard decoder 104 (i.e., the input data handler 202) receives the first LDPC codeword CW1 from the memory controller 103. For the sake of ongoing discussion, it is assumed that the input data handler 202, the variable node updater 210, the syndrome generator 212, the error detector 214, and the threshold generator 216 are activated, and the output data handler 222 is deactivated. In other words, the first and fourth through seventh control signals CS1 and CS4-CS7 are deactivated and the eighth control signal CS8 is activated. The input data handler 202 rearranges the first plurality of codeword bits of the first LDPC codeword CW1 to generate the third LDPC codeword CW3. The first plurality of codeword bits are rearranged based on the reuse factor associated with the hard decoder 104.

The hard decoder 104 (i.e., the input data handler 202) may then receive the second LDPC codeword CW2 from the memory controller 103, and rearrange a second plurality of codeword bits of the second LDPC codeword CW2 based on the reuse factor to generate the fourth LDPC codeword CW4. For the sake of ongoing discussion, it is assumed that the second control signal CS2 is deactivated when the input data handler 202 generates the third and fourth LDPC codewords CW3 and CW4. Thus, the third and fourth LDPC codewords CW3 and CW4 are stored in the second memory 206 by way the mux 204. It is further assumed that the third control signal CS3 is activated. Hence, the variable node updater 210 receives the third LDPC codeword CW3 by way of the demux 208 (i.e., the second output terminal of the demux 208).

During time period T0-T2 (i.e., during the first decoding iteration of the third LDPC codeword CW3), the variable node updater 210 updates the one or more sets of codeword bits of the third LDPC codeword CW3 such that the updated third LDPC codeword UCW3 is same as the third LDPC codeword CW3. When the variable node updater 210 generates the updated third LDPC codeword UCW3, the second control signal CS2 is activated. The updated third LDPC codeword UCW3 is thus stored in the second memory 206 by way of the mux 204. Additionally, the variable node updater 210 generates and stores the first update information IU1 in the third memory 218.

The syndrome generator 212 then receives the updated third LDPC codeword UCW3 (i.e., the one or more sets of updated codeword bits of the updated third LDPC codeword UCW3 in a sequential manner). Further, based on the received updated third LDPC codeword UCW3, the syndrome generator 212 generates the first syndrome vector SV1 having the one or more sets of syndrome values associated with the one or more sets of the updated codeword bits, respectively. The syndrome generator 212 generates the first set of syndrome values associated with the first set of updated codeword bits while the variable node updater 210 generates the second set of updated codeword bits. The syndrome generator 212 then stores the first syndrome vector SV1 in the third memory 218. The updated third LDPC codeword UCW3, the first update information IU1, and the first syndrome vector SV1 of the first decoding iteration of the third LDPC codeword CW3 are generated during time period T0-T1.

The error detector 214 receives the first syndrome vector SV1 generated during the first decoding iteration of the third LDPC codeword CW3, and detects whether the updated third LDPC codeword UCW3 of the first decoding iteration is valid. For the sake of ongoing discussion, it is assumed that the updated third LDPC codeword UCW3 of the first decoding iteration is invalid. In such a scenario, the error detector 214 generates the first status bit SB1 in a deactivated state, and stores the first status bit SB1 in the third memory 218. Additionally, the error detector 214 provides the first status bit SB1 to the decode controller 220. As the first status bit SB1 is deactivated, the output data handler 222 remains deactivated. Further, the threshold generator 216 receives the first syndrome vector SV1 generated during the first decoding iteration of the third LDPC codeword CW3, and retrieves the first update information IU1 from the third memory 218. Based on the first syndrome vector SV1 and the first update information IU1, the threshold generator 216 generates the third intermediate value, and converts the third intermediate value to the first threshold value TH1. The third intermediate value is converted to the first threshold value TH1 such that the number of bits indicative of the first threshold value TH1 is less than the number of bits indicative of the third intermediate value. The threshold generator 216 then stores the first threshold value TH1 in the third memory 218. The first status bit SB1 and the first threshold value TH1 of the first decoding iteration of the third LDPC codeword CW3 are generated during time period T1-T2. The hard decoder 104 thus executes the first decoding iteration of the third LDPC codeword CW3 during the time period T0-T2.

While the error detector 214 detects whether the updated third LDPC codeword UCW3 is valid and the threshold generator 216 generates the first threshold value TH1, the variable node updater 210 receives and updates the fourth LDPC codeword CW4 to generate the updated fourth LDPC codeword UCW4 and the syndrome generator 212 generates the second syndrome vector SV2. The update of the fourth LDPC codeword CW4 and the generation of the second syndrome vector SV2 are similar to the update of the third LDPC codeword CW3 and the generation of the first syndrome vector SV1, respectively. Thus, the updated fourth LDPC codeword UCW4, the second update information IU2, and the second syndrome vector SV2 of a first decoding iteration of the fourth LDPC codeword CW4 are generated during the time period T1-T2.

During time period T2-T4 (i.e., during a second decoding iteration of the third LDPC codeword CW3), the variable node updater 210 retrieves the first status bit SB1 from the third memory 218. As the first status bit SB1 indicates that the updated third LDPC codeword UCW3 of the first decoding iteration is invalid, the variable node updater 210 initiates the retrieval of the updated third LDPC codeword UCW3 from the second memory 206. The variable node updater 210 thus receives, by way of the demux 208, the updated third LDPC codeword UCW3 that is stored in the second memory 206 during the first decoding iteration. The variable node updater 210 then retrieves, from the third memory 218, the first syndrome vector SV1, the first threshold value TH1, and the first update information IU1 associated with the updated third LDPC codeword UCW3 of the previous decoding iteration (i.e., the first decoding iteration).

The variable node updater 210 then identifies the number of syndrome values of the first syndrome vector SV1 that is associated with each codeword bit. For each codeword bit, the variable node updater 210 generates the first intermediate value based on the identified number of syndrome values and the retrieved first update information IU1, and converts the first intermediate value to the second intermediate value. The first intermediate value is converted to the second intermediate value such that the number of bits indicative of the second intermediate value is less than the number of bits indicative of the first intermediate value, and equal to the number of bits indicative of the first threshold value TH1.

The variable node updater 210 compares, for each codeword bit, the first threshold value TH1 and the associated second intermediate value. Each codeword bit is updated based on the result of the comparison of the first threshold value TH1 and the associated second intermediate value. For example, when the result of the comparison indicates that the first threshold value TH1 is less than or equal to the second intermediate value, the associated codeword bit is flipped (i.e., a logic state of the codeword bit is toggled). Similarly, when the result of the comparison indicates that the first threshold value TH1 is greater than the second intermediate value, a logic state of the associated codeword bit is retained. The variable node updater 210 then generates and stores, in the third memory 218, the first update information IU1 associated with the generation of the updated third LDPC codeword UCW3 of the second decoding iteration. The updated third LDPC codeword UCW3 of the second decoding iteration is then stored in the second memory 206 by way of the mux 204. Further, the syndrome generator 212 receives the updated third LDPC codeword UCW3, and generates the first syndrome vector SV1 based on the updated third LDPC codeword UCW3 of the second decoding iteration. The updated third LDPC codeword UCW3, the first update information IU1, and the first syndrome vector SV1 of the second decoding iteration of the third LDPC codeword CW3 are generated during time period T2-T3.

While the updated third LDPC codeword UCW3 and the first syndrome vector SV1 of the second decoding iteration of the third LDPC codeword CW3 are generated, the error detector 214 detects whether the updated fourth LDPC codeword UCW4 generated during the first decoding iteration of the fourth LDPC codeword CW4 is valid and the threshold generator 216 generates the second threshold value TH2 associated with the updated fourth LDPC codeword UCW4. The detection of the validity of the updated fourth LDPC codeword UCW4 (i.e., the generation of the second status bit SB2) and the generation of the second threshold value TH2 are similar to the detection of the validity of the updated third LDPC codeword UCW3 (i.e., the generation of the first status bit SB1) and the generation of the first threshold value TH1, respectively. The second status bit SB2 and the second threshold value TH2 of the first decoding iteration of the fourth LDPC codeword CW4 are thus generated during the time period T2-T3. In other words, the hard decoder 104 executes the first decoding iteration of the fourth LDPC codeword CW4 during time period T1-T3. The hard decoder 104 of the present disclosure thus facilitates decoding of the third and fourth LDPC codewords CW3 and CW4 (i.e., the first and second LDPC codewords CW1 and CW2, respectively) in a pipelined manner.

Upon the generation of the first syndrome vector SV1 during the second decoding iteration of the third LDPC codeword CW3, the syndrome generator 212 stores the first syndrome vector SV1 in the third memory 218. Further, the error detector 214 receives the first syndrome vector SV1 generated during the second decoding iteration, and detects whether the updated third LDPC codeword UCW3 of the second decoding iteration is valid. For the sake of ongoing discussion, it is assumed that the updated third LDPC codeword UCW3 of the second decoding iteration is invalid. In such a scenario, the error detector 214 generates the first status bit SB1 in a deactivated state, and stores the first status bit SB1 in the third memory 218. Additionally, the error detector 214 provides the first status bit SB1 to the decode controller 220. As the first status bit SB1 is deactivated, the output data handler 222 remains deactivated.

The threshold generator 216 receives the first syndrome vector SV1 generated during the second decoding iteration, and retrieves the first update information IU1 of the second decoding iteration from the third memory 218. Based on the first syndrome vector SV1 and the first update information IU1, the threshold generator 216 generates the third intermediate value, converts the third intermediate value to the first threshold value TH1, and stores the first threshold value TH1 in the third memory 218. The first status bit SB1 and the first threshold value TH1 of the second decoding iteration of the third LDPC codeword CW3 are generated during time period T3-T4. The hard decoder 104 thus executes the second decoding iteration of the third LDPC codeword CW3 during the time period T2-T4. The first syndrome vector SV1, the first update information IU1, and the first threshold value TH1 of the second decoding iteration are utilized for update of the third LDPC codeword CW3 during a subsequent decoding iteration (i.e., a third decoding iteration of the third LDPC codeword CW3).

While the validity of the updated third LDPC codeword UCW3 is detected and the first threshold value TH1 is generated, the updated fourth LDPC codeword UCW4 and the second syndrome vector SV2 of a second decoding iteration of the fourth LDPC codeword CW4 are generated by the variable node updater 210 and the syndrome generator 212, respectively. The updated fourth LDPC codeword UCW4, the second update information IU2, and the second syndrome vector SV2 of the second decoding iteration of the fourth LDPC codeword CW4 are thus generated during the time period T3-T4.

During time period T4-T6 (i.e., during the third decoding iteration of the third LDPC codeword CW3), the variable node updater 210 retrieves the first status bit SB1 of the second decoding iteration from the third memory 218. The first status bit SB1 of the second decoding iteration is deactivated, thereby indicating that the updated third LDPC codeword UCW3 of the second decoding iteration is invalid. The variable node updater 210 thus initiates the retrieval of the updated third LDPC codeword UCW3 of the second decoding iteration from the second memory 206.

The variable node updater 210 receives the updated third LDPC codeword UCW3 of the second decoding iteration by way of the demux 208. The variable node updater 210 then retrieves, from the third memory 218, the first syndrome vector SV1, the first threshold value TH1, and the first update information IU1 associated with the updated third LDPC codeword UCW3 of the previous decoding iteration (i.e., the second decoding iteration). Further, the variable node updater 210 identifies the number of syndrome values of the first syndrome vector SV1 that is associated with each codeword bit. For each codeword bit, the variable node updater 210 generates the first intermediate value based on the identified number of syndrome values and the retrieved first update information IU1, and converts the first intermediate value to the second intermediate value. Further, the variable node updater 210 compares, for each codeword bit, the first threshold value TH1 and the associated second intermediate value. Each codeword bit is updated based on the result of the comparison of the first threshold value TH1 and the associated second intermediate value. The variable node updater 210 then generates and stores, in the third memory 218, the first update information IU1 associated with the generation of the updated third LDPC codeword UCW3 of the third decoding iteration.

The updated third LDPC codeword UCW3 is then stored in the second memory 206 by way of the mux 204, and the syndrome generator 212 generates the first syndrome vector SV1 based on the updated third LDPC codeword UCW3. The updated third LDPC codeword UCW3, the first update information IU1, and the first syndrome vector SV1 of the third decoding iteration of the third LDPC codeword CW3 are generated during time period T4-T5. While the updated third LDPC codeword UCW3 and the first syndrome vector SV1 of the third decoding iteration of the third LDPC codeword CW3 are generated, the error detector 214 detects whether the updated fourth LDPC codeword UCW4 generated during the second decoding iteration of the fourth LDPC codeword CW4 is valid and the threshold generator 216 generates the second threshold value TH2 associated with the updated fourth LDPC codeword UCW4. The detection of the validity of the updated fourth LDPC codeword UCW4 (i.e., the generation of the second status bit SB2) and the generation of the second threshold value TH2 are similar to the detection of the validity of the updated third LDPC codeword UCW3 (i.e., the generation of the first status bit SB1) and the generation of the first threshold value TH1, respectively. The second status bit SB2 and the second threshold value TH2 of the second decoding iteration of the fourth LDPC codeword CW4 are thus generated during the time period T4-T5. In other words, the hard decoder 104 executes the second decoding iteration of the fourth LDPC codeword CW4 during time period T3-T5.

Upon the generation of the first syndrome vector SV1 during the third decoding iteration of the third LDPC codeword CW3, the syndrome generator 212 stores the first syndrome vector SV1 in the third memory 218. Further, the error detector 214 receives the first syndrome vector SV1 generated during the third decoding iteration, and detects whether the updated third LDPC codeword UCW3 of the third decoding iteration is valid. For the sake of ongoing discussion, it is assumed that the updated third LDPC codeword UCW3 of the third decoding iteration is valid. In such a scenario, the error detector 214 generates the first status bit SB1 in an activated state, and stores the first status bit SB1 in the third memory 218. Additionally, the error detector 214 provides the first status bit SB1 to the decode controller 220.

The first status bit SB1 of the third decoding iteration of the third LDPC codeword CW3 is generated during time period T5-T6. As the first status bit SB1 is activated, the first threshold value TH1 is not generated for the third decoding iteration of the third LDPC codeword CW3. The hard decoder 104 thus executes the third decoding iteration of the third LDPC codeword CW3 during the time period T4-T6. It will be apparent to a person skilled in the art that the updated third LDPC codeword UCW3 that is valid is shown to be generated in three decoding iterations of the third LDPC codeword CW3 to make the illustrations concise and clear and should not be considered as a limitation of the present disclosure. Further, it will be apparent to a person skilled in the art that the hard decoder 104 executes the third decoding iteration of the fourth LDPC codeword CW4 during time period T5-T7. For the sake of ongoing discussion, it is assumed that the updated fourth LDPC codeword UCW4 generated during the third decoding iteration of the fourth LDPC codeword CW4 is invalid, and one or more additional decoding iterations are required to generate the updated fourth LDPC codeword UCW4 that is valid. Further, each of time periods T0-T1, T1-T2, T2-T3, T3-T4, T4-T5, T5-T6, and T6-T7 is equal to the predetermined number of cycles of the clock signal associated with the hard decoder 104.

The decode controller 220 then generates the eighth control signal CS8 such that the eighth control signal CS8 is deactivated after the updated fourth LDPC codeword UCW4 is received from the second memory 206 by the variable node updater 210 during the third decoding iteration of the fourth LDPC codeword CW4. Additionally, the third control signal CS3 is deactivated after the updated fourth LDPC codeword UCW4 is received from the second memory 206 by the variable node updater 210 during a third decoding iteration of the fourth LDPC codeword CW4. When the third and eighth control signals CS3 and CS8 are deactivated, the output data handler 222 receives a first portion of the updated third LDPC codeword UCW3 that is valid. The output data handler 222 extracts a first set of message bits from the first portion of the updated third LDPC codeword UCW3.

The third and eighth control signals CS3 and CS8 are deactivated during various decoding iterations of the fourth LDPC codeword CW4 and/or the fifth LDPC codeword for a predetermined time duration after the corresponding LDPC codewords are received by the variable node updater 210. Thus, during each subsequent decoding iteration, the output data handler 222 receives a second portion of the updated third LDPC codeword UCW3, and extracts a second set of message bits from the received portion. As a result, over a plurality of decoding iterations of the fourth LDPC codeword CW4 and/or the fifth LDPC codeword, the entirety of the updated third LDPC codeword UCW3 is received by the output data handler 222, and the first message MSG1 is extracted. Alternatively, the output data handler 222 extracts the first message MSG1 upon the reception of the entirety of the updated third LDPC codeword UCW3. Further, the output data handler 222 outputs and provides the first message MSG1 to the circuitry 106.

It will be apparent to a person skilled in the art that the second message MSG2 is outputted by the output data handler 222 in a similar manner as described above. Additionally, the decoding of the fifth LDPC codeword is executed in a manner similar to that of the third and fourth LDPC codewords CW3 and CW4, respectively. Further, after the decoding of the fifth LDPC codeword, the decode controller 220 generates the first and fourth through eighth control signals CS1 and CS4-CS8 in an activated state to deactivate the hard decoder 104.

FIGS. 4A-4F, collectively, represent a flowchart that illustrates a method for decoding LDPC codewords, in accordance with an exemplary embodiment of the present disclosure. Referring to FIGS. 4A-4F, the flowchart 400 is shown. The first memory 102 of the memory system 100 is configured to store various LDPC codewords (such as the first and second LDPC codewords CW1 and CW2). The memory controller 103 accesses the first memory 102 to retrieve the first LDPC codeword CW1.

Figure 4A:
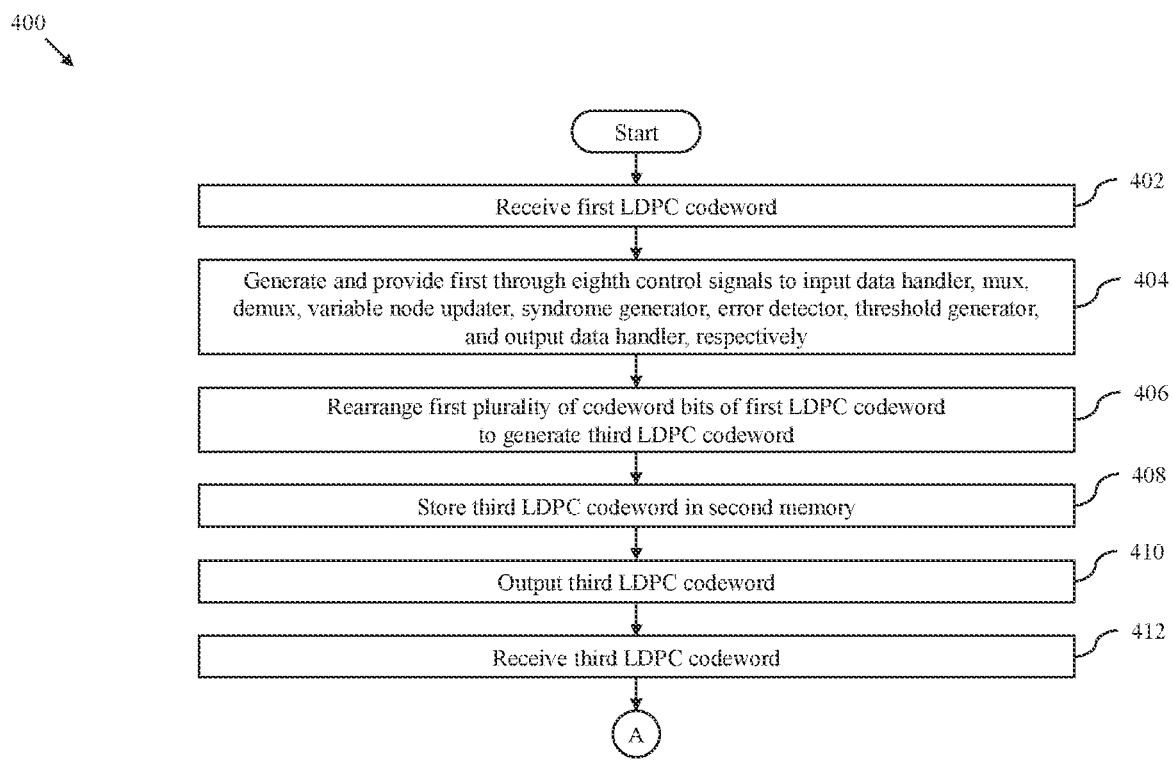
FIGS. 4A-4F, collectively, represent a flowchart that illustrates a method for decoding LDPC codewords, in accordance with an exemplary embodiment of the present disclosure.

Referring to FIG. 4A, at 402, the first LDPC codeword CW1 is received. The input data handler 202 is configured to receive the first LDPC codeword CW1 from the first memory 102 by way of the memory controller 103. At 404, the first through eighth control signals CS1-CS8 are generated and provided to the input data handler 202, the mux 204, the demux 208, the variable node updater 210, the syndrome generator 212, the error detector 214, the threshold generator 216, and the output data handler 222, respectively. The decode controller 220 is configured to generate and provide the first through eighth control signals CS1-CS8 to the input data handler 202, the mux 204, the demux 208, the variable node updater 210, the syndrome generator 212, the error detector 214, the threshold generator 216, and the output data handler 222, respectively. For the sake of ongoing discussion, it is assumed that the input data handler 202, the variable node updater 210, the syndrome generator 212, the error detector 214, and the threshold generator 216 are activated, and the output data handler 222 is deactivated.

At 406, the first plurality of codeword bits of the first LDPC codeword CW1 is rearranged to generate the third LDPC codeword CW3. The input data handler 202 is further configured to rearrange the first plurality of codeword bits of the first LDPC codeword CW1 to generate the third LDPC codeword CW3. The first plurality of codeword bits are rearranged based on the reuse factor associated with the hard decoder 104. For the sake of ongoing discussion, it is assumed that the second control signal CS2 is deactivated when the input data handler 202 generates the third LDPC codeword CW3. At 408, the third LDPC codeword CW3 is stored in the second memory 206. The mux 204 is configured to store the third LDPC codeword CW3 in the second memory 206 when the second control signal CS2 is deactivated and the third LDPC codeword CW3 is received at the first input terminal thereof. It is further assumed that the third control signal CS3 is activated when the third LDPC codeword CW3 is stored in the second memory 206.

At 410, the third LDPC codeword CW3 is outputted. The demux 208 is configured to output the third LDPC codeword CW3 when the third control signal CS3 is activated and the third LDPC codeword CW3 is received at the input terminal thereof. At 412, the third LDPC codeword CW3 is received. The variable node updater 210 is configured to receive the third LDPC codeword CW3 from the demux 208.

Figure 4B:
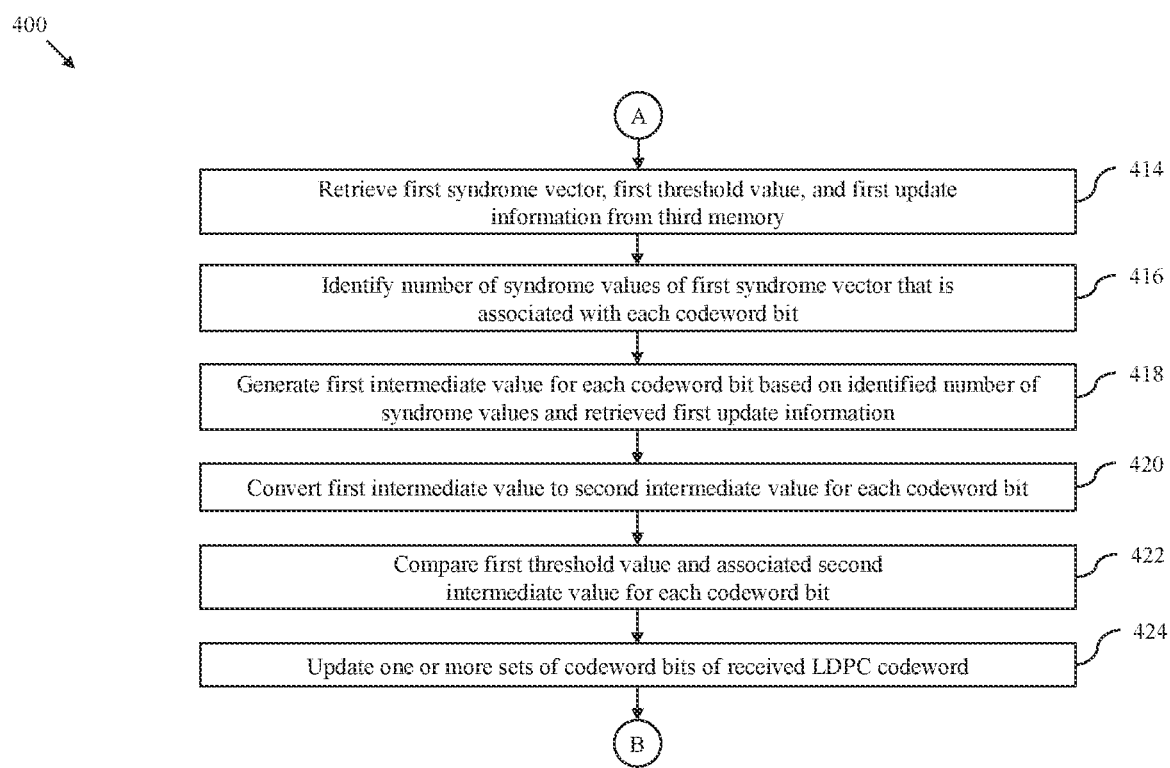

Referring to FIG. 4B, at 414, the first syndrome vector SV1, the first threshold value TH1, and the first update information IU1 are retrieved from the third memory 218. The variable node updater 210 is further configured to retrieve, from the third memory 218, the first syndrome vector SV1, the first threshold value TH1, and the first update information IU1. At 416, the number of syndrome values of the first syndrome vector SV1 that is associated with each codeword bit is identified. The variable node updater 210 is further configured to identify the number of syndrome values of the first syndrome vector SV1 that is associated with each codeword bit. At 418, the first intermediate value is generated for each codeword bit based on the identified number of syndrome values and the retrieved first update information IU1. The variable node updater 210 is further configured to generate the first intermediate value for each codeword bit based on the identified number of syndrome values and the retrieved first update information IU1. At 420, the first intermediate value is converted to the second intermediate value for each codeword bit. The variable node updater 210 is further configured to convert, for each codeword bit, the first intermediate value to the second intermediate value. The first intermediate value is converted to the second intermediate value such that the number of bits indicative of the second intermediate value is less than the number of bits indicative of the first intermediate value, and equal to the number of bits indicative of the first threshold value TH1.

At 422, the first threshold value TH1 and the associated second intermediate value are compared for each codeword bit. The variable node updater 210 is further configured to compare, for each codeword bit, the first threshold value TH1 and the associated second intermediate value. At 424, the one or more sets of codeword bits of the received LDPC codeword (i.e., the third LDPC codeword CW3) is updated. The variable node updater 210 is further configured to update the one or more sets of codeword bits of the received LDPC codeword. Each codeword bit is updated based on the result of the comparison of the first threshold value TH1 and the associated second intermediate value. The one or more sets of codeword bits of the received LDPC codeword (i.e., the third LDPC codeword CW3) is updated to generate the updated third LDPC codeword UCW3.

The first syndrome vector SV1, the first threshold value TH1, and the first update information IU1 are associated with the updated third LDPC codeword UCW3 of a previous decoding iteration of the third LDPC codeword CW3. Thus, during the first decoding iteration of the third LDPC codeword CW3, the variable node updater 210 updates the one or more sets of codeword bits of the third LDPC codeword CW3 such that the updated third LDPC codeword UCW3 is same as the third LDPC codeword CW3.

Figure 4C:
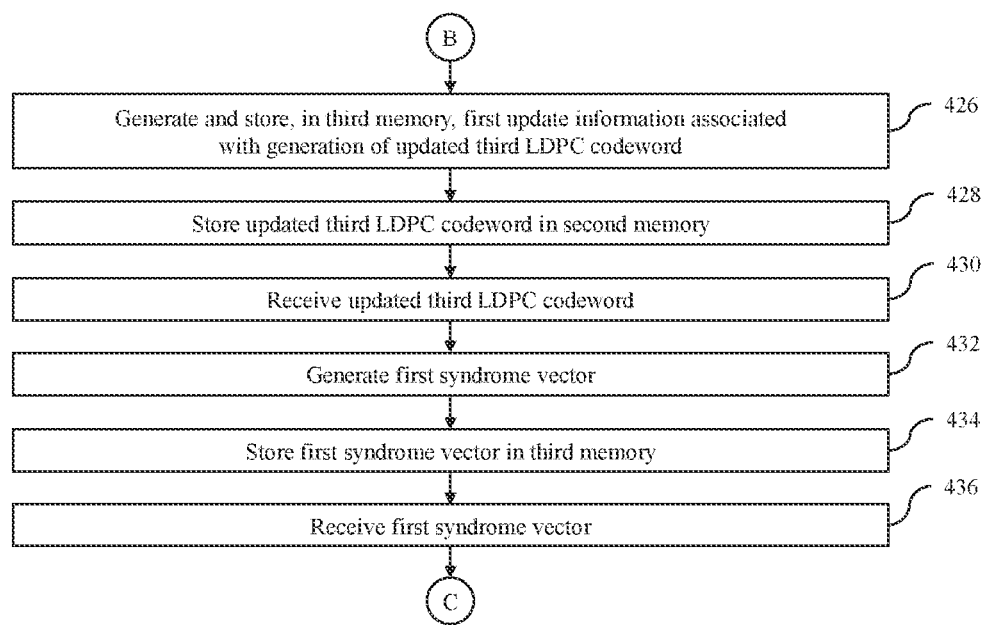

Referring to FIG. 4C, at 426, the first update information IU1 associated with the generation of the updated third LDPC codeword UCW3 is generated and stored in the third memory 218. The variable node updater 210 is further configured to generate and store, in the third memory 218, the first update information IU1 associated with the generation of the updated third LDPC codeword UCW3 of the second decoding iteration. Further, it is assumed that the second control signal CS2 is activated when the updated third LDPC codeword UCW3 is generated. At 428, the updated third LDPC codeword UCW3 is stored in the second memory 206. The mux 204 is further configured to store the updated third LDPC codeword UCW3 in the second memory 206 when the second control signal CS2 is activated and the updated third LDPC codeword UCW3 is received at the second input terminal thereof.

At 430, the updated third LDPC codeword UCW3 is received. The syndrome generator 212 is configured to receive the updated third LDPC codeword UCW3 from the variable node updater 210. At 432, the first syndrome vector SV1 is generated. The syndrome generator 212 is further configured to generate the first syndrome vector SV1 based on the updated third LDPC codeword UCW3. The first syndrome vector SV1 includes the one or more sets of syndrome values associated with the one or more sets of updated codeword bits of the updated third LDPC codeword UCW3, respectively. The first set of syndrome values associated with the first set of updated codeword bits is generated while the second set of updated codeword bits is generated. At 434, the first syndrome vector SV1 is stored in the third memory 218. The syndrome generator 212 is configured to store the first syndrome vector SV1 in the third memory 218. At 436, the first syndrome vector SV1 is received. The error detector 214 is configured to receive the first syndrome vector SV1 from the syndrome generator 212.

Figure 4D:
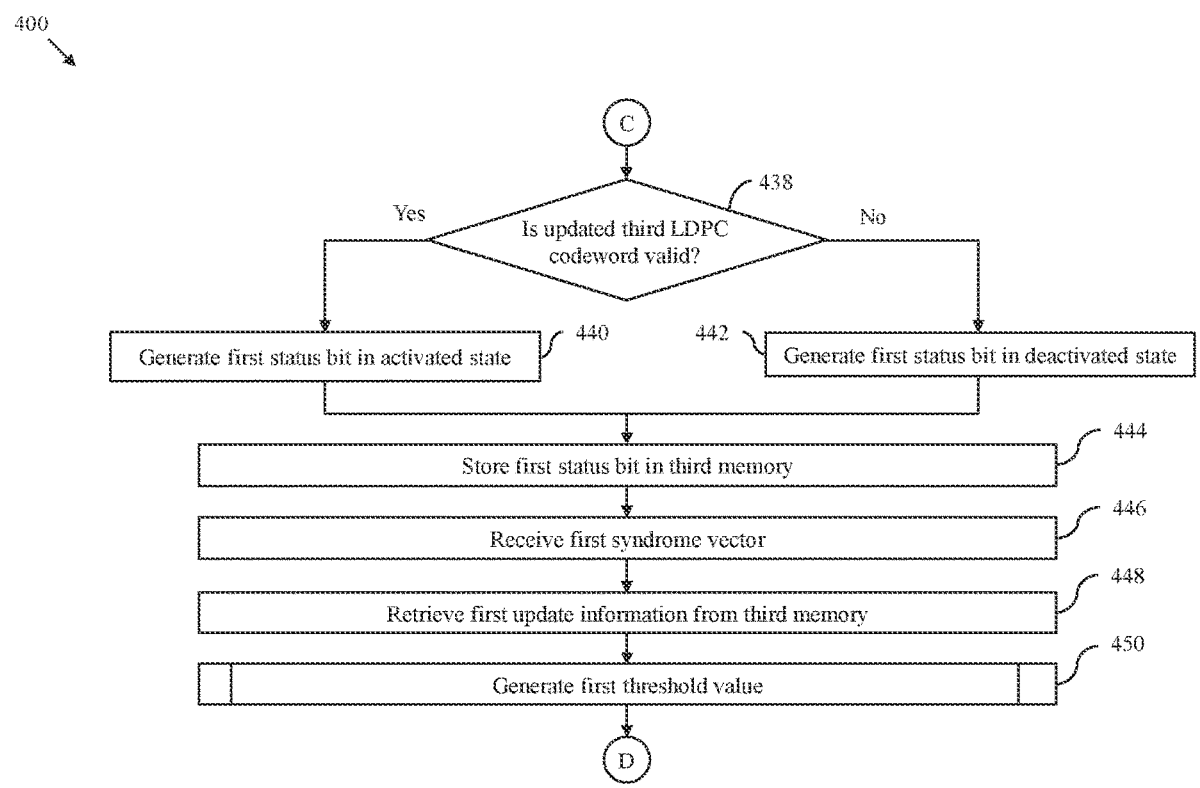

Referring to FIG. 4D, at 438, detect whether the updated third LDPC codeword UCW3 is valid. The error detector 214 is configured to detect whether the updated third LDPC codeword UCW3 is valid. If at 438, the error detector 214 detects that the updated third LDPC codeword UCW3 is valid, 440 is performed. At 440, the first status bit SB1 is generated in an activated state. The error detector 214 is further configured to generate the first status bit SB1 in an activated state. If at 438, the error detector 214 detects that the updated third LDPC codeword UCW3 is invalid, 442 is performed. At 442, the first status bit SB1 is generated in a deactivated state. The error detector 214 is further configured to generate the first status bit SB1 in a deactivated state. At 444, the first status bit SB1 is stored in the third memory 218. The error detector 214 is further configured to store the first status bit SB1 in the third memory 218.

At 446, the first syndrome vector SV1 is received. The threshold generator 216 is configured to receive the first syndrome vector SV1 from the syndrome generator 212. At 448, the first update information IU1 is retrieved from the third memory 218. The threshold generator 216 is further configured to retrieve the first update information IU1 from the third memory 218. At 450, the first threshold value TH1 is generated. The threshold generator 216 is further configured to generate the first threshold value TH1 based on the first syndrome vector SV1 and the first update information IU1.

Figure 4E:
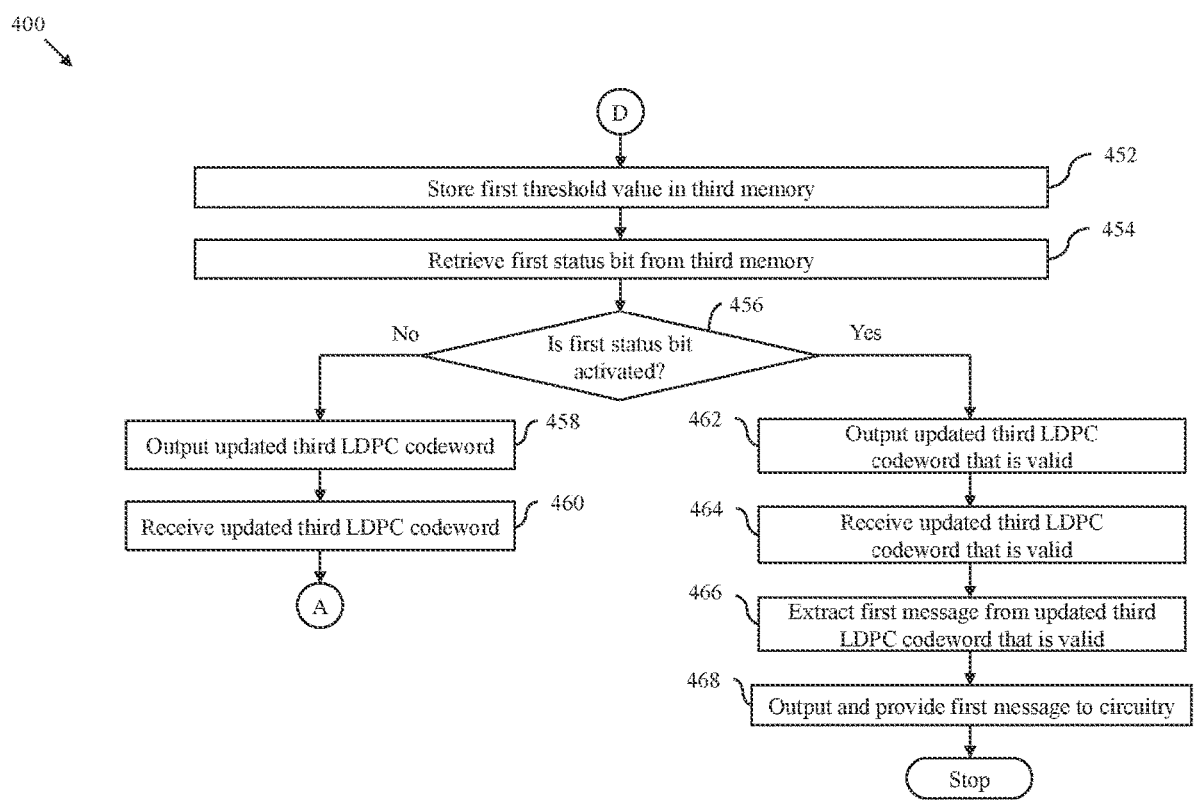
Figure 4F:
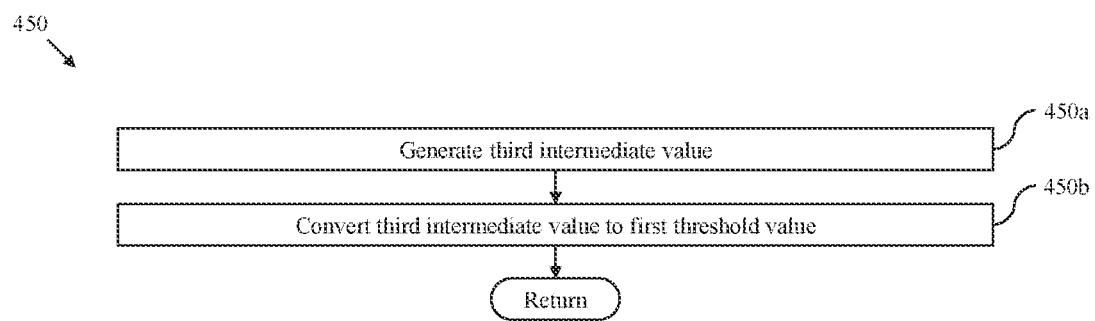

Referring to FIG. 4F, at 450a, the third intermediate value is generated. The threshold generator 216 is further configured to generate the third intermediate value based on the first syndrome vector SV1 and the first update information IU1. At 450b, the third intermediate value is converted to the first threshold value TH1. The threshold generator 216 is further configured to convert the third intermediate value to the first threshold value TH1 such that the number of bits indicative of the first threshold value TH1 is less than the number of bits indicative of the third intermediate value.

Referring to FIG. 4E, at 452, the first threshold value TH1 is stored in the third memory 218. The threshold generator 216 is further configured to store the first threshold value TH1 in the third memory 218. At 454, the first status bit SB1 is retrieved from the third memory 218. The variable node updater 210 is further configured to retrieve the first status bit SB1 from the third memory 218. At 456, determine whether the first status bit SB1 is activated. The variable node updater 210 is further configured to determine whether the first status bit SB1 is activated. If at 456, the variable node updater 210 determines that the first status bit SB1 is deactivated (i.e., the first status bit SB1 indicates that the updated third LDPC codeword UCW3 is invalid), 458 is performed. At 458, the updated third LDPC codeword UCW3 is outputted. The demux 208 is configured to output the updated third LDPC codeword UCW3 when the third control signal CS3 is activated and the updated third LDPC codeword UCW3 is received at the input terminal thereof. At 460, the updated third LDPC codeword UCW3 is received. The variable node updater 210 is further configured to receive the updated third LDPC codeword UCW3 from the demux 208. Upon reception of the updated third LDPC codeword UCW3, 414 is performed.

If at 456, the variable node updater 210 determines that the first status bit SB1 is activated (i.e., the first status bit SB1 indicates that the updated third LDPC codeword UCW3 is valid), 462 is performed. At 462, the updated third LDPC codeword UCW3 that is valid is outputted. The demux 208 is configured to output the updated third LDPC codeword UCW3 that is valid when the third control signal CS3 is deactivated and the valid updated third LDPC codeword UCW3 is received at the input terminal thereof. At 464, the updated third LDPC codeword UCW3 that is valid is received. The output data handler 222 is configured to receive the updated third LDPC codeword UCW3 that is valid from the demux 208. At 466, the first message MSG1 is extracted from the updated third LDPC codeword UCW3 that is valid. The output data handler 222 is further configured to extract the first message MSG1 from the valid updated third LDPC codeword UCW3. At 468, the first message MSG1 is outputted and provided to the circuitry 106. The output data handler 222 is further configured to output and provide the first message MSG1 to the circuitry 106.

It will be apparent to a person skilled in the art that the second LDPC codeword CW2 is decoded in a similar manner as described above. Further, while the error detector 214 detects whether the updated third LDPC codeword UCW3 is valid and the threshold generator 216 generates the first threshold value TH1, the variable node updater 210 is further configured to receive and update the fourth LDPC codeword CW4 to generate the updated fourth LDPC codeword UCW4 and the syndrome generator 212 is further configured to generate the second syndrome vector SV2. The update of the fourth LDPC codeword CW4 and the generation of the second syndrome vector SV2 are similar to the update of the third LDPC codeword CW3 and the generation of the first syndrome vector SV1, respectively. Similarly, while the variable node updater 210 and the syndrome generator 212 generate the updated third LDPC codeword UCW3 and the first syndrome vector SV1, the error detector 214 is further configured to detect whether the updated fourth LDPC codeword UCW4 is valid and the threshold generator 216 is further configured to generate the second threshold value TH2. The detection of the validity of the updated fourth LDPC codeword UCW4 (i.e., the generation of the second status bit SB2) and the generation of the second threshold value TH2 are similar to the detection of the validity of the updated third LDPC codeword UCW3 (i.e., the generation of the first status bit SB1) and the generation of the first threshold value TH1, respectively. The hard decoder 104 thus facilitates decoding of the third and fourth LDPC codewords CW3 and CW4 (i.e., the first and second LDPC codewords CW1 and CW2, respectively) in a pipelined manner.

Various embodiments of the disclosure provide the memory system 100 that includes the circuitry 106, the first memory 102 that is configured to store the first LDPC codeword CW1, and the hard decoder 104 that is coupled to the first memory 102 and the circuitry 106. The hard decoder 104 for LDPC codes includes the input data handler 202 that is configured to receive the first LDPC codeword CW1 from the first memory 102. The input data handler 202 is further configured to rearrange, based on the reuse factor associated with the hard decoder 104, the first plurality of codeword bits of the first LDPC codeword CW1 to generate the third LDPC codeword CW3 that includes the one or more sets of codeword bits. The hard decoder 104 further includes the variable node updater 210 that is configured to iteratively update the one or more sets of codeword bits of the third LDPC codeword CW3 to generate the updated third LDPC codeword UCW3 during each decoding iteration of the third LDPC codeword CW3.

The hard decoder 104 further includes the second memory 206 that is configured to store the third LDPC codeword CW3 and the updated third LDPC codeword UCW3 of each decoding iteration of the third LDPC codeword CW3. The hard decoder 104 further includes the mux 204 that includes first and second input terminals, a select terminal, and an output terminal. The first input terminal of the mux 204 is coupled to the input data handler 202, and is configured to receive the third LDPC codeword CW3. The second input terminal of the mux 204 is coupled to the variable node updater 210, and is configured to receive the updated third LDPC codeword UCW3 of each decoding iteration. Further, the select terminal of the mux 204 is configured to receive the second control signal CS2. The output terminal of the mux 204 is coupled to the second memory 206, and is configured to output and store one of the third LDPC codeword CW3 or the updated third LDPC codeword UCW3 in the second memory 206 based on the second control signal CS2. The hard decoder 104 further includes the decode controller 220 that is configured to generate the second control signal CS2. When the second control signal CS2 is deactivated, the third LDPC codeword CW3 is stored in the second memory 206, and when the second control signal CS2 is activated, the updated third LDPC codeword UCW3 is stored in the second memory 206.

The hard decoder 104 further includes the syndrome generator 212 that is configured to generate, during each decoding iteration based on the updated third LDPC codeword UCW3 of the corresponding decoding iteration, the first syndrome vector SV1 having the one or more sets of syndrome values associated with the one or more sets of updated codeword bits of the updated third LDPC codeword UCW3, respectively. The first set of syndrome values associated with the first set of updated codeword bits is generated while the second set of updated codeword bits is generated.

The hard decoder 104 further includes the error detector 214 that is coupled to the syndrome generator 212, and is configured to receive, during each decoding iteration of the third LDPC codeword CW3, the first syndrome vector SV1 of the corresponding decoding iteration. The error detector 214 is further configured to detect, during each decoding iteration, whether the updated third LDPC codeword UCW3 of the corresponding decoding iteration is valid based on the first syndrome vector SV1 of the corresponding decoding iteration. Further, the error detector 214 is configured to generate, during each decoding iteration, the first status bit SB1 to indicate the validity of the updated third LDPC codeword UCW3 of the corresponding decoding iteration. The first status bit SB1 is activated when the updated third LDPC codeword UCW3 is valid, and deactivated when the updated third LDPC codeword UCW3 is invalid.

The hard decoder 104 further includes the threshold generator 216 that is coupled to the syndrome generator 212, and is configured to receive, during each decoding iteration of the third LDPC codeword CW3, the first syndrome vector SV1 of the corresponding decoding iteration. The threshold generator 216 is further configured to generate, during each decoding iteration based on the first syndrome vector SV1 of the corresponding decoding iteration, the first threshold value TH1 associated with the updated third LDPC codeword UCW3 of the corresponding decoding iteration. During each decoding iteration, the third LDPC codeword CW3 is updated based on the first threshold value TH1 and the first syndrome vector SV1 associated with the updated third LDPC codeword UCW3 of the previous decoding iteration and the validity of the updated third LDPC codeword UCW3 of the previous decoding iteration.

The hard decoder 104 further includes the third memory 218 that is coupled to the syndrome generator 212, the variable node updater 210, the error detector 214, and the threshold generator 216. During each decoding iteration of the third LDPC codeword CW3, the syndrome generator 212 is further configured to store, in the third memory 218, the first syndrome vector SV1 of the corresponding decoding iteration, and the error detector 214 is further configured to store, in the third memory 218, the first status bit SB1 of the corresponding decoding iteration. Further, during each decoding iteration, the threshold generator 216 is configured to store, in the third memory 218, the first threshold value TH1 associated with the updated third LDPC codeword UCW3 of the corresponding decoding iteration, and the variable node updater 210 is configured to generate and store, in the third memory 218, the first update information IU1 associated with the generation of the updated third LDPC codeword UCW3 of the corresponding decoding iteration.

The threshold generator 216 is further configured to retrieve, from the third memory 218 during each decoding iteration, the first update information IU1 of the corresponding decoding iteration. During each decoding iteration, the threshold generator 216 further generates the first threshold value TH1 based on the first update information IU1 of the corresponding decoding iteration. To generate the first threshold value TH1 during each decoding iteration, the threshold generator 216 is further configured to generate the third intermediate value based on the first syndrome vector SV1 and the retrieved first update information IU1 of the corresponding decoding iteration, and convert the third intermediate value to the first threshold value TH1. The third intermediate value is converted to the first threshold value TH1 such that the number of bits indicative of the first threshold value TH1 is less that the number of bits indicative of the third intermediate value.

During each decoding iteration of the third LDPC codeword CW3, the variable node updater 210 is further configured to retrieve, from the third memory 218, the first status bit SB1 of the previous decoding iteration, and determine whether the first status bit SB1 indicates that the updated third LDPC codeword UCW3 of the previous decoding iteration is valid. The variable node updater 210 updates each codeword bit of the third LDPC codeword CW3 when the first status bit SB1 indicates that the updated third LDPC codeword UCW3 of the previous decoding iteration is invalid. To update each codeword bit of the third LDPC codeword CW3 during each decoding iteration, the variable node updater 210 is further configured to retrieve, from the third memory 218, the first syndrome vector SV1, the first threshold value TH1, and the first update information IU1 associated with the updated third LDPC codeword UCW3 of the previous decoding iteration. The variable node updater 210 is further configured to identify a number of syndrome values of the first syndrome vector SV1 that is associated with each codeword bit, and generate the first intermediate value for each codeword bit based on the identified number of syndrome values and the first update information IU1. Further, the variable node updater 210 is configured to convert, for each codeword bit, the first intermediate value to the second intermediate value such that the number of bits indicative of the second intermediate value is less than the number of bits indicative of the first intermediate value, and equal to the number of bits indicative of the first threshold value TH1. The variable node updater 210 is further configured to compare, for each codeword bit, the first threshold value TH1 and the associated second intermediate value. Each codeword bit of the third LDPC codeword CW3 is updated based on a result of the comparison of the first threshold value TH1 and the associated second intermediate value.

The hard decoder 104 further includes the output data handler 222 that is configured to receive the updated third LDPC codeword UCW3 that is valid. The output data handler 222 receives the updated third LDPC codeword UCW3 over a plurality of decoding iterations of one or more LDPC codewords that are subsequent to the third LDPC codeword CW3 such that during each decoding iteration of the one or more LDPC codewords, the output data handler 222 receives a portion of the updated third LDPC codeword UCW3. The output data handler 222 is further configured to extract the first message MSG1 from the updated third LDPC codeword UCW3, and output the extracted first message MSG1. The output data handler 222 is coupled to the circuitry 106, and is further configured to provide the extracted first message MSG1 to the circuitry 106.

The hard decoder 104 further includes the demux 208 that includes an input terminal, a select terminal, and first and second output terminals. The input terminal of the demux 208 is coupled to the second memory 206, and is configured to receive one of the third LDPC codeword CW3 or the updated third LDPC codeword UCW3. The input terminal of the demux 208 receives the third LDPC codeword CW3 during the first decoding iteration of the third LDPC codeword, and during each subsequent decoding iteration, the input terminal of the demux 208 receives the updated third LDPC codeword UCW3 of the previous decoding iteration. The select terminal of the demux 208 is configured to receive the third control signal CS3. Further, the first and second output terminals of the demux 208 are coupled to the output data handler 222 and the variable node updater 210, respectively. Based on the third control signal CS3, the first output terminal of the demux 208 is configured to output and provide the updated third LDPC codeword UCW3 that is valid to the output data handler 222, and the second output terminal of the demux 208 is configured to output and provide one of the third LDPC codeword CW3 or the updated third LDPC codeword UCW3 that is invalid to the variable node updater 210. The decode controller 220 is further configured to generate the third control signal CS3. When the third control signal CS3 is deactivated, the updated third LDPC codeword UCW3 that is valid is outputted and provided to the output data handler 222, and when the third control signal CS3 is activated, one of the third LDPC codeword CW3 or the updated third LDPC codeword UCW3 that is invalid is outputted and provided to the variable node updater 210.

The input data handler 202 is further configured to receive the second LDPC codeword CW2, and rearrange, based on the reuse factor, the second plurality of codeword bits of the second LDPC codeword CW2 to generate the fourth LDPC codeword CW4. The variable node updater 210 is further configured to iteratively update the fourth LDPC codeword CW4 to generate the updated fourth LDPC codeword UCW4 during each decoding iteration of the fourth LDPC codeword CW4. The syndrome generator 212 is further configured to generate, during each decoding iteration of the fourth LDPC codeword CW4 based on the updated fourth LDPC codeword UCW4 of the corresponding decoding iteration, the second syndrome vector SV2 associated with the updated fourth LDPC codeword UCW4. The output data handler 222 is further configured to receive the updated fourth LDPC codeword UCW4 that is valid, extract the second message MSG2 from the updated fourth LDPC codeword UCW4, and output and provide the extracted second message MSG2 to the circuitry 106. The variable node updater 210 updates the fourth LDPC codeword CW4 and the syndrome generator 212 generates the second syndrome vector SV2 while the error detector 214 detects whether the updated third LDPC codeword UCW3 is valid and the threshold generator 216 generates the first threshold value TH1 associated with the updated third LDPC codeword UCW3.

The error detector 214 is further configured to receive the second syndrome vector SV2 of each decoding iteration of the fourth LDPC codeword CW4, and detect whether the updated fourth LDPC codeword UCW4 of the corresponding decoding iteration is valid. The threshold generator 216 is further configured to receive the second syndrome vector SV2 of each decoding iteration of the fourth LDPC codeword CW4, and generate the second threshold value TH2 associated with the updated fourth LDPC codeword UCW4 of the corresponding decoding iteration. The error detector 214 detects whether the updated fourth LDPC codeword UCW4 is valid and the threshold generator 216 generates the second threshold value TH2 while the variable node updater 210 and the syndrome generator 212 generate the updated third LDPC codeword UCW3 and the first syndrome vector SV1 of the subsequent decoding iteration of the third LDPC codeword CW3, respectively.

The disclosed embodiments encompass numerous advantages. Exemplary advantages of the disclosed hard decoders include, but are not limited to, ensuring a significant decrease in an area occupied by the hard decoder 104 on the memory system 100 and a significant increase in a throughput of the hard decoder 104. In the hard decoder 104, one set of syndrome values of a syndrome vector (e.g., the first and second syndrome vectors SV1 and SV2) is generated after the update of one set of codeword bits of an LDPC codeword (e.g., the third and fourth LDPC codewords CW3 and CW4), and while another set of codeword bits of the LDPC codeword is updated. Further, each set of syndrome values, and in turn each set of updated codeword bits, are generated over a single cycle of the clock signal associated with the hard decoder 104. As a result, the throughput of the hard decoder 104 is significantly greater than that of a conventional partial parallel hard decoder where various codeword bits and syndrome values are generated over multiple cycles of an associated clock signal, and the syndrome values are generated exclusively after all the codeword bits are updated. Additionally, the decoding of two LDPC codewords (e.g., the third and fourth LDPC codewords CW3 and CW4) in a pipelined manner further increases the throughput of the hard decoder 104. Further, the hard decoder 104 of the present disclosure occupies significantly less area on the memory system 100 as compared to an area occupied by another conventional partial parallel hard decoder where codeword bits are updated over multiple cycles of an associated clock signal, and the syndrome values are generated over a single cycle of the associated clock signal and exclusively after all the codeword bits are updated. The conversion of the first and third intermediate values to the second intermediate value and the first threshold value TH1, respectively, prior to the update of the one or more sets of codeword bits of an LDPC codeword (such as the third and fourth LDPC codewords CW3 and CW4) further decreases the area occupied by the hard decoder 104 on the memory system 100.

Techniques consistent with the disclosure provide, among other features, a hard decoder for low-density parity-check codes. While various exemplary embodiments of the disclosed hard decoder have been described above, it should be understood that they have been presented for purposes of example only, and not limitations. It is not exhaustive and does not limit the disclosure to the precise form disclosed. Modifications and variations are possible in light of the above teachings or may be acquired from practicing of the disclosure, without departing from the breadth or scope.

While various embodiments of the disclosure have been illustrated and described, it will be clear that the disclosure is not limited to these embodiments only. Numerous modifications, changes, variations, substitutions, and equivalents will be apparent to those skilled in the art, without departing from the spirit and scope of the disclosure, as described in the claims.

The invention claimed is:

1. A hard decoder for low-density parity-check (LDPC) codes, the hard decoder comprising:
  an input data handler that is configured to receive a first LDPC codeword, and rearrange, based on a reuse factor associated with the hard decoder, a first plurality of codeword bits of the first LDPC codeword to generate a second LDPC codeword that includes one or more sets of codeword bits;
  a variable node updater that is configured to iteratively update the one or more sets of codeword bits of the second LDPC codeword to generate an updated second LDPC codeword during each decoding iteration of the second LDPC codeword;
  a syndrome generator that is configured to generate, during each decoding iteration based on the updated second LDPC codeword of the corresponding decoding iteration, a first syndrome vector having one or more sets of syndrome values associated with one or more sets of updated codeword bits of the updated second LDPC codeword, respectively,
    wherein a first set of syndrome values associated with a first set of updated codeword bits is generated while a second set of updated codeword bits is generated, and
    wherein during each decoding iteration, the second LDPC codeword is updated based on a first threshold value and the first syndrome vector associated with the updated second LDPC codeword of a previous decoding iteration and a validity of the updated second LDPC codeword of the previous decoding iteration; and
  an output data handler that is configured to receive the updated second LDPC codeword that is valid, extract a first message from the updated second LDPC codeword, and output the extracted first message.

2. The hard decoder of claim 1, further comprising a first memory that is configured to store the second LDPC codeword and the updated second LDPC codeword of each decoding iteration.

3. The hard decoder of claim 2, further comprising a multiplexer that comprises:
  a first input terminal that is coupled to the input data handler, and is configured to receive the second LDPC codeword;
  a second input terminal that is coupled to the variable node updater, and is configured to receive the updated second LDPC codeword of each decoding iteration;
  a select terminal that is configured to receive a first control signal; and
  an output terminal that is coupled to the first memory, and is configured to output and store one of the second LDPC codeword or the updated second LDPC codeword in the first memory based on the first control signal.

4. The hard decoder of claim 3, further comprising a decode controller that is configured to generate the first control signal, wherein when the first control signal is deactivated, the second LDPC codeword is stored in the first memory, and when the first control signal is activated, the updated second LDPC codeword is stored in the first memory.

5. The hard decoder of claim 2, further comprising a demultiplexer that comprises:
  an input terminal that is coupled to the first memory, and is configured to receive one of the second LDPC codeword or the updated second LDPC codeword, wherein the input terminal of the demultiplexer receives the second LDPC codeword during a first decoding iteration, and during each subsequent decoding iteration, the input terminal of the demultiplexer receives the updated second LDPC codeword of the previous decoding iteration;
  a select terminal that is configured to receive a second control signal; and
  first and second output terminals coupled to the output data handler and the variable node updater, respectively, wherein based on the second control signal, the first output terminal of the demultiplexer is configured to output and provide the updated second LDPC codeword that is valid to the output data handler, and the second output terminal of the demultiplexer is configured to output and provide one of the second LDPC codeword or the updated second LDPC codeword that is invalid to the variable node updater.

6. The hard decoder of claim 5, further comprising a decode controller that is configured to generate the second control signal, wherein when the second control signal is deactivated, the updated second LDPC codeword that is valid is outputted and provided to the output data handler, and when the second control signal is activated, one of the second LDPC codeword or the updated second LDPC codeword that is invalid is outputted and provided to the variable node updater.

7. The hard decoder of claim 1, further comprising:
an error detector that is coupled to the syndrome generator, and is configured to:
receive, during each decoding iteration, the first syndrome vector of the corresponding decoding iteration;
detect, during each decoding iteration, whether the updated second LDPC codeword of the corresponding decoding iteration is valid based on the first syndrome vector of the corresponding decoding iteration; and
generate, during each decoding iteration, a status bit to indicate the validity of the updated second LDPC codeword of the corresponding decoding iteration, wherein the status bit is activated when the updated second LDPC codeword is valid, and deactivated when the updated second LDPC codeword is invalid; and
a threshold generator that is coupled to the syndrome generator, and is configured to:
receive, during each decoding iteration, the first syndrome vector of the corresponding decoding iteration; and
generate, during each decoding iteration based on the first syndrome vector of the corresponding decoding iteration, the first threshold value associated with the updated second LDPC codeword of the corresponding decoding iteration.

8. The hard decoder of claim 7, further comprising a second memory that is coupled to the syndrome generator, the variable node updater, the error detector, and the threshold generator, wherein during each decoding iteration:
the syndrome generator is further configured to store, in the second memory, the first syndrome vector of the corresponding decoding iteration,
the error detector is further configured to store, in the second memory, the status bit of the corresponding decoding iteration,
the threshold generator is further configured to store, in the second memory, the first threshold value associated with the updated second LDPC codeword of the corresponding decoding iteration, and
the variable node updater is further configured to generate and store, in the second memory, update information associated with the generation of the updated second LDPC codeword of the corresponding decoding iteration.

9. The hard decoder of claim 8, wherein the threshold generator is further configured to retrieve, from the second memory during each decoding iteration, the update information of the corresponding decoding iteration, wherein during each decoding iteration, the threshold generator further generates the first threshold value based on the update information of the corresponding decoding iteration, and wherein to generate the first threshold value during each decoding iteration, the threshold generator is further configured to:

generate a first intermediate value based on the first syndrome vector and the retrieved update information of the corresponding decoding iteration; and
convert the first intermediate value to the first threshold value such that a number of bits indicative of the first threshold value is less than a number of bits indicative of the first intermediate value.

10. The hard decoder of claim 8, wherein during each decoding iteration, the variable node updater is further configured to:
retrieve, from the second memory, the status bit of the previous decoding iteration; and
determine whether the status bit indicates that the updated second LDPC codeword of the previous decoding iteration is valid.

11. The hard decoder of claim 10, wherein to update each codeword bit of the second LDPC codeword during each decoding iteration, the variable node updater is further configured to:
retrieve, from the second memory when the status bit indicates that the updated second LDPC codeword of the previous decoding iteration is invalid, the first syndrome vector, the first threshold value, and the update information associated with the updated second LDPC codeword of the previous decoding iteration;
identify a number of syndrome values of the first syndrome vector that is associated with each codeword bit;
generate a second intermediate value for each codeword bit based on the identified number of syndrome values and the update information;
convert, for each codeword bit, the second intermediate value to a third intermediate value such that a number of bits indicative of the third intermediate value is less than a number of bits indicative of the second intermediate value, and equal to the number of bits indicative of the first threshold value; and
compare, for each codeword bit, the first threshold value and the associated third intermediate value, wherein each codeword bit of the second LDPC codeword is updated based on a result of the comparison of the first threshold value and the associated third intermediate value.

12. The hard decoder of claim 7, wherein:
the input data handler is further configured to receive a third LDPC codeword, and rearrange a second plurality of codeword bits of the third LDPC codeword to generate a fourth LDPC codeword,
the variable node updater is further configured to iteratively update the fourth LDPC codeword to generate an updated fourth LDPC codeword during each decoding iteration of the fourth LDPC codeword,
the syndrome generator is further configured to generate, during each decoding iteration of the fourth LDPC codeword based on the updated fourth LDPC codeword of the corresponding decoding iteration, a second syndrome vector associated with the updated fourth LDPC codeword,
the output data handler is further configured to receive the updated fourth LDPC codeword that is valid, extract a second message from the updated fourth LDPC codeword, and output the extracted second message, and
the variable node updater updates the fourth LDPC codeword and the syndrome generator generates the second syndrome vector while the error detector detects whether the updated second LDPC codeword is valid and the threshold generator generates the first threshold value associated with the updated second LDPC codeword.

13. The hard decoder of claim 12, wherein:
the error detector is further configured to receive the second syndrome vector of each decoding iteration of the fourth LDPC codeword, and detect whether the updated fourth LDPC codeword of the corresponding decoding iteration is valid,
the threshold generator is further configured to receive the second syndrome vector of each decoding iteration of the fourth LDPC codeword, and generate a second threshold value associated with the updated fourth LDPC codeword of the corresponding decoding iteration, and
the error detector detects whether the updated fourth LDPC codeword is valid and the threshold generator generates the second threshold value while the variable node updater and the syndrome generator generate the updated second LDPC codeword and the first syndrome vector of a subsequent decoding iteration of the second LDPC codeword, respectively.

14. The hard decoder of claim 1, wherein the output data handler receives the updated second LDPC codeword over a plurality of decoding iterations of one or more LDPC codewords that are subsequent to the second LDPC codeword such that during each decoding iteration of the one or more LDPC codewords, the output data handler receives a portion of the updated second LDPC codeword.

15. A memory system, comprising:
circuitry;
a first memory that is configured to store a first low-density parity-check (LDPC) codeword; and
a hard decoder coupled to the first memory and the circuitry, the hard decoder comprising:
an input data handler that is coupled to the first memory, and is configured to receive the first LDPC codeword, and rearrange, based on a reuse factor associated with the hard decoder, a plurality of codeword bits of the first LDPC codeword to generate a second LDPC codeword that includes one or more sets of codeword bits;
a variable node updater that is configured to iteratively update the one or more sets of codeword bits of the second LDPC codeword to generate an updated second LDPC codeword during each decoding iteration of the second LDPC codeword;
a syndrome generator that is configured to generate, during each decoding iteration based on the updated second LDPC codeword of the corresponding decoding iteration, a first syndrome vector having one or more sets of syndrome values associated with one or more sets of updated codeword bits of the updated second LDPC codeword, respectively,
wherein a first set of syndrome values associated with a first set of updated codeword bits is generated while a second set of updated codeword bits is generated, and
wherein during each decoding iteration, the second LDPC codeword is updated based on a first threshold value and the first syndrome vector associated with the updated second LDPC codeword of a previous decoding iteration and a validity of the updated second LDPC codeword of the previous decoding iteration; and
an output data handler that is coupled to the circuitry, and is configured to receive the updated second LDPC codeword that is valid, extract a first message from the updated second LDPC codeword, and output and provide the extracted first message to the circuitry.

16. The memory system of claim 15, wherein the hard decoder further includes:
a second memory;
a multiplexer that comprises:
a first input terminal that is coupled to the input data handler, and is configured to receive the second LDPC codeword;
a second input terminal that is coupled to the variable node updater, and is configured to receive the updated second LDPC codeword of each decoding iteration;
a select terminal that is configured to receive a first control signal; and
an output terminal that is coupled to the second memory, and is configured to output and store one of the second LDPC codeword or the updated second LDPC codeword in the second memory based on the first control signal, wherein when the first control signal is deactivated, the second LDPC codeword is stored in the second memory and when the first control signal is activated, the updated second LDPC codeword is stored in the second memory; and
a demultiplexer that comprises:
an input terminal that is coupled to the second memory, and is configured to receive one of the second LDPC codeword or the updated second LDPC codeword, wherein the input terminal of the demultiplexer receives the second LDPC codeword during a first decoding iteration, and during each subsequent decoding iteration, the input terminal of the demultiplexer receives the updated second LDPC codeword of the previous decoding iteration;
a select terminal that is configured to receive a second control signal; and
first and second output terminals coupled to the output data handler and the variable node updater, respectively, wherein when the second control signal is deactivated, the first output terminal of the demultiplexer is configured to output and provide the updated second LDPC codeword that is valid to the output data handler, and wherein when the second control signal is activated, the second output terminal of the demultiplexer is configured to output and provide one of the second LDPC codeword or the updated second LDPC codeword that is invalid to the variable node updater.

17. The memory system of claim 15, wherein the hard decoder further includes:
an error detector that is coupled to the syndrome generator, and is configured to:
receive, during each decoding iteration, the first syndrome vector of the corresponding decoding iteration;
detect, during each decoding iteration, whether the updated second LDPC codeword of the corresponding decoding iteration is valid based on the first syndrome vector of the corresponding decoding iteration; and
generate, during each decoding iteration, a status bit to indicate the validity of the updated second LDPC codeword of the corresponding decoding iteration, wherein the status bit is activated when the updated second LDPC codeword is valid, and deactivated when the updated second LDPC codeword is invalid; and a threshold generator that is coupled to the syndrome generator, and is configured to:
  receive, during each decoding iteration, the first syndrome vector of the corresponding decoding iteration; and
  generate, during each decoding iteration based on the first syndrome vector of the corresponding decoding iteration, the first threshold value associated with the updated second LDPC codeword of the corresponding decoding iteration.

18. The memory system of claim 17, wherein the hard decoder further includes a third memory that is coupled to the syndrome generator, the variable node updater, the error detector, and the threshold generator, and wherein during each decoding iteration:
  the syndrome generator is further configured to store, in the third memory, the first syndrome vector of the corresponding decoding iteration,
  the error detector is further configured to store, in the third memory, the status bit of the corresponding decoding iteration,
  the threshold generator is further configured to store, in the third memory, the first threshold value associated with the updated second LDPC codeword of the corresponding decoding iteration, and
  the variable node updater is further configured to generate and store, in the third memory, update information associated with the generation of the updated second LDPC codeword of the corresponding decoding iteration.

19. The memory system of claim 18, wherein the threshold generator is further configured to retrieve, from the third memory during each decoding iteration, the update information of the corresponding decoding iteration, wherein during each decoding iteration, the threshold generator further generates the first threshold value based on the update information of the corresponding decoding iteration, and wherein to generate the first threshold value during each decoding iteration, the threshold generator is further configured to:
  generate a first intermediate value based on the first syndrome vector and the retrieved update information of the corresponding decoding iteration; and
  convert the first intermediate value to the first threshold value such that a number of bits indicative of the first threshold value is less than a number of bits indicative of the first intermediate value.

20. The memory system of claim 18, wherein to update each codeword bit of the second LDPC codeword during each decoding iteration, the variable node updater is further configured to:
  retrieve, from the third memory when the status bit indicates that the updated second LDPC codeword of the previous decoding iteration is invalid, the first syndrome vector, the first threshold value, and the update information associated with the updated second LDPC codeword of the previous decoding iteration;
  identify a number of syndrome values of the first syndrome vector that is associated with each codeword bit;
  generate a second intermediate value for each codeword bit based on the identified number of syndrome values and the update information;
  convert, for each codeword bit, the second intermediate value to a third intermediate value such that a number of bits indicative of the third intermediate value is less than a number of bits indicative of the second intermediate value, and equal to the number of bits indicative of the first threshold value; and
  compare, for each codeword bit, the first threshold value and the associated third intermediate value, wherein each codeword bit of the second LDPC codeword is updated based on a result of the comparison of the first threshold value and the associated third intermediate value.

* * * * *